(12) United States Patent
Soeta

(10) Patent No.: US 7,380,337 B2
(45) Date of Patent: Jun. 3, 2008

(54) HOLDER FOR ELECTRONIC COMPONENT, HOLDING SHEET FOR ELECTRONIC COMPONENT, ELECTRONIC MODULE USING HOLDER, ELECTRONIC MODULE USING HOLDING SHEET, LAMINATION OF ELECTRONIC MODULES, METHOD FOR MANUFACTURING ELECTRONIC MODULE, AND METHOD FOR TESTING ELECTRONIC MODULE

(75) Inventor: Kaoru Soeta, Tokyo (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 11/378,826

(22) Filed: Mar. 17, 2006

(65) Prior Publication Data

US 2006/0207789 A1    Sep. 21, 2006

(30) Foreign Application Priority Data

Mar. 18, 2005    (JP)    ............................. 2005-079904

(51) Int. Cl.
*H05K 3/30*    (2006.01)

(52) U.S. Cl. ............................. 29/832; 29/830; 29/854; 29/876; 29/593

(58) Field of Classification Search ................ 174/250, 174/260; 361/600; 257/678, 701
See application file for complete search history.

(56) References Cited

U.S. PATENT DOCUMENTS 5,802,699 A * 9/1998 Fjelstad et al. ................ 29/593
6,517,362 B2 2/2003 Hirai et al.
6,640,415 B2 * 11/2003 Eslamy et al. ................ 29/593
6,674,178 B1 1/2004 Ikegami
6,705,876 B2 3/2004 Eldridge
6,717,275 B2 4/2004 Matsuura et al.
2002/0037657 A1 3/2002 Hirai et al.

FOREIGN PATENT DOCUMENTS

| JP | 2001-093938 | 4/2001 |
|---|---|---|
| JP | 2002-175859 | 6/2002 |
| JP | 2002-357622 | 12/2002 |
| JP | 2003-133518 | 5/2003 |
| JP | 2004-128192 | 4/2004 |

* cited by examiner

*Primary Examiner*—Diego Gutierrez
*Assistant Examiner*—Hoa C Nguyen
(74) *Attorney, Agent, or Firm*—Brinks Hofer Gilson & Lione

(57) ABSTRACT

A first cavity in a holder is provided with a plurality of spiral contactors and a thermosetting adhesive member. In a state where a first bare chip is mounted in the first cavity and spherical contactors on the first bare chip are pressed against the plurality of spiral contactors, various tests are performed. If the result of the test is pass, the holder is heated so that the adhesive member becomes hard and rigid by being heated. This can perform securing while a good connection between the first bare chip and the holder is maintained. If the result of the test is fail, only the first bare chip is removed and replaced with a new bare chip.

3 Claims, 16 Drawing Sheets

HOLDER FOR ELECTRONIC COMPONENT, HOLDING SHEET FOR ELECTRONIC COMPONENT, ELECTRONIC MODULE USING HOLDER, ELECTRONIC MODULE USING HOLDING SHEET, LAMINATION OF ELECTRONIC MODULES, METHOD FOR MANUFACTURING ELECTRONIC MODULE, AND METHOD FOR TESTING ELECTRONIC MODULE

BACKGROUND OF THE INVENTION

1. Field of the Invention

The present invention relates to a holder for an electronic component having an electrode, such as a semiconductor bare chip, a thermal head, or a charge-coupled device (CCD), a holding sheet for the same, an electronic module using the holder, an electronic module using the holding sheet, a lamination of electronic modules, a method for manufacturing an electronic module, and a method for testing an electronic module.

2. Description of the Related Art

Pitches of electrodes in semiconductor bare chips are typically about 20 to 100 µm, so the bare chips are difficult to work with if they are not processed. Therefore, it is necessary to extend the distance between the electrodes to the order of 500 µm. To this end, a bare chip is usually modularized on a package board (substrate) such that the distance between the electrodes is extended and the re-routing is realized. Such a module packaging technique is disclosed in, for example, Japanese Unexamined Patent Application Publication Nos. 2004-128192 and 2003-133518 (which corresponds to U.S. Pat. No. 6,717,275).

FIG. 14 in Japanese Unexamined Patent Application Publication No. 2004-128192 illustrates a laminated module in which a bare chip (41) is embedded in a multilayer substrate (9). In this multilayer module, a stepped cavity (91) including a first cavity section (92) and a second cavity section (93) is formed on a front surface of the multilayer substrate (9). The bare chip (41) is placed on a bottom surface of the first cavity section (92), and a plurality of signal terminals (95) are arranged on a bottom surface of the second cavity section (93). The bare chip (41) is connected to each of the signal terminals (95) with a wire (96).

FIG. 9 in U.S. Pat. No. 6,717,275 illustrates as an eighth embodiment a semiconductor module formed by vertically stacking a plurality of substrates (25), each substrate having semiconductor chips (120) which are bare chips on both front and back surface thereof. In this semiconductor module, the adjoining substrates (25) are connected to each other with a flexible cable (30). The substrates (25) and the corresponding semiconductor chips (120) are secured with an anisotropic conducting film (121) disposed therebetween.

In a case where a bare chip for analog use and a bare chip for digital use are packaged by using the technique described above, for example, impedance matching between both the bare chips is required. Therefore, a matching test is performed in a quality inspection process.

Conventional matching tests are performed in a state in which terminal electrodes of a bare chip have been soldered to terminal electrodes of a substrate, i.e., in a state in which a module can be shipped as a product. As a result, a module that has been determined to have faulty matching is discarded.

However, as a result of examining a module that has been determined to have faulty matching, it is found that the faulty matching can be recovered by replacing one of the bare chips for analog use and for digital use with another, thus overcoming a fault of matching in many cases. In other words, although a faulty matching problem can be solved by changing a combination of the bare chip for analog use and that for digital use in many cases, a module that has been determined to have faulty matching is often discarded without changing one of the bare chips. This means that a good bare chip is wasted.

For the module that has been determined to have faulty matching, performing a matching test again after removing one of the bare chips for analog use and for digital use from the substrate to replace the bare chip with a new one and changing to a new combination can eliminate the waste described above.

However, removing the bare chip soldered to the substrate is very troublesome. Additionally, since melting solder requires heating the bare chip, an unnecessary thermal stress is applied to the module. This causes a problem in which the bare chip and the substrate are prone to being damaged.

SUMMARY OF THE INVENTION

The present invention aims to solve the foregoing problems. It is an object of the present invention to provide a holder for an electronic component and a holding sheet for an electronic component which are capable of removing a small electronic component, such as a semiconductor bare chip, in a testing process and capable of, if the result of the test is pass, securing the component without removal and provide an electronic module and a lamination of electronic modules using one of the holder and the holding sheet.

Another object of the present invention is to provide a method for manufacturing such an electronic module and a method for testing the same.

According to a first aspect of the present invention, a holder for an electronic component includes a cavity for mounting an electronic component having an electrode therein, connecting means disposed on a first surface of the holder within the cavity so as to be opposed to the electrode, and external contactors conductively connected to the connecting means and disposed on a second surface of the holder, the second surface being opposite the cavity. The connecting means is provided with elastic contacts that allow the connecting means to be connected to and disconnected from the electrode freely.

According to a second aspect of the present invention, each of the elastic contacts is a spiral contactor.

According to a third aspect of the present invention, the elastic contacts and the external contactors are arranged so as to satisfy W2>W1, where W1 is the pitch distance between the neighboring elastic contacts within the cavity and W2 is the pitch distance between the neighboring external contactors disposed on the second surface opposite the cavity.

According to a fourth aspect of the present invention, a stepped portion is formed within the cavity.

According to a fifth aspect of the present invention, an electronic module includes a holder for an electronic component, the holder comprising a cavity for mounting an electronic component having an electrode therein, connecting means disposed on a first surface of the holder within the cavity so as to be opposed to the electrode and provided with elastic contacts that allow the connecting means to be connected to and disconnected from the electrode freely, and external contactors conductively connected to the connecting means and disposed on a second surface of the holder, the second surface being opposite the cavity, and an electronic component having an electrode that is mounted in the cavity of the holder. The electronic component is secured to the cavity by one of a thermosetting adhesive member and a thermoplastic adhesive member.

According to a sixth aspect of the present invention, the electronic component is a bare chip.

A seventh aspect of the present invention relates to a lamination in which two or more electronic modules described above are stacked.

According to an eighth aspect of the present invention, a method for manufacturing an electronic module includes a first step of mounting a set of electronic components having electrodes and one of thermosetting adhesive members and thermoplastic adhesive members in cavities of a holder for an electronic component, the holder comprising the cavities for mounting the set of electronic components therein, connecting means disposed on a first surface of the holder within each of the cavities so as to be opposed to the electrodes and provided with elastic contacts that allow the connecting means to be connected to and disconnected from the electrodes freely, and external contactors conductively connected to the connecting means and disposed on a second surface of the holder, the second surface being opposite each of the cavities, a second step of attaching the holder to a securing member and setting electrical continuity between the electrodes of the set of electronic components and the connecting means of the holder, a third step of receiving an externally input electrical signal and performing a matching test between the set of electronic components in the holder, and a fourth step of adhesively securing the set of electronic components to the cavities using the adhesive members by heating the holder.

A ninth aspect of the present invention relates to the method for manufacturing an electronic module. When the result of the matching test in the third step is fail, the first step to the third step are performed again from the first step after one electronic component of the set of electronic components is replaced with another new electronic component.

According to a tenth aspect of the present invention, a method for testing an electronic module, the method includes a first step of mounting a set of electronic components having electrodes and one of thermosetting adhesive members and thermoplastic adhesive members in cavities of a holder for an electronic component, the holder comprising the cavities for mounting the set of electronic components therein, connecting means disposed on a first surface of the holder within each of the cavities so as to be opposed to the electrodes and provided with elastic contacts that allow the connecting means to be connected to and disconnected from the electrodes freely, and external contactors conductively connected to the connecting means and disposed on a second surface of the holder, the second surface being opposite each of the cavities, a second step of attaching the holder to a securing member and setting and maintaining electrical continuity between the electrodes of the set of electronic components and the connecting means of the holder, and a third step of receiving an externally input electrical signal and performing a matching test between the set of electronic components in the holder.

According to an eleventh aspect of the present invention, a holding sheet for an electronic component includes a sheet having a plurality of mounting portions at a first side of the sheet, each mounting portion being used for mounting an electronic component having an electrode thereon and provided with connecting means for connecting to the electrode, and external contactors conductively connected to the connecting means in a continuous manner and disposed on a second side of the sheet, the second side being opposite the mounting portions. Each of the connecting means is provided with elastic contacts that allow the connecting means to be connected to and disconnected from the electrode freely.

According to a twelfth aspect of the present invention, each of the elastic contacts is a spiral contactor.

According to a thirteenth aspect of the present invention, a first elastic contact of a first mounting portion of the plurality of mounting portions is conductively connected to a second elastic contact of a second mounting portion of the plurality of mounting portions via a wiring pattern formed on the sheet.

According to a fourteenth aspect of the present invention, the sheet is in the form of tape that linearly extends in one direction.

According to a fifteenth aspect of the present invention, the holding sheet further includes a folding portion disposed between the neighboring mounting portions.

According to a sixteenth aspect of the present invention, an electronic module includes a holding sheet comprising a sheet having a plurality of mounting portions at a first side of the sheet, each mounting portion being used for mounting an electronic component having an electrode thereon and provided with connecting means for connecting to the electrode, and external contactors conductively connected to the connecting means in a continuous manner and disposed on a second side of the sheet, the second side being opposite the mounting portions, and a plurality of electronic components mounted on the corresponding mounting portions of the holding sheet. A first electronic component of the plurality of electronic components is stacked above a second electronic component of the plurality of electronic components, and an upper electronic component and a lower electronic component are connected to each other via the holding sheet.

According to a seventeenth aspect of the present invention, the electronic components are secured to the holding sheet by one of a thermosetting adhesive member and a thermoplastic adhesive member.

According to an eighteenth aspect of the present invention, a method for manufacturing an electronic module, the method includes a first step of mounting a holding sheet, a plurality of electronic components, and one of a thermosetting adhesive member and a thermoplastic adhesive member in a securing device, the holding sheet comprising a sheet having a plurality of mounting portions at a first side of the sheet, each mounting portion being used for mounting an electronic component having an electrode thereon and provided with connecting means for connecting to the electrode, the connecting means being provided with elastic contacts that allow the connecting means to be connected to and disconnected from the electrode freely, and external contactors conductively connected to the connecting means in a continuous manner and disposed on a second side of the sheet, the second side being opposite each of the mounting portions, a second step of receiving an externally input electrical signal and performing a matching test between the plurality of electronic components, and a third step of adhesively securing the plurality of electronic components to the holding sheet by heating the securing device in which the plurality of electronic components are mounted.

According to a nineteenth aspect of the present invention, the method further includes a fourth step of stacking a first electronic component above a second electronic component by folding the holding sheet after the third step is performed.

According to a twentieth aspect of the present invention, The method according to Claim 18, wherein, when the result of the matching test in the second step is fail, the first and second steps are performed again from the first step after one electronic component of the plurality of electronic components is replaced with another new electronic component.

According to a twenty-first aspect of the present invention, a method for testing an electronic module includes a first step of mounting a holding sheet, a plurality of electronic components, and one of a thermosetting adhesive member and a thermoplastic adhesive member in a securing device, the holding sheet comprising a sheet having a plurality of mounting portions at a first side of the sheet, each mounting portion being used for mounting an electronic component having an electrode thereon and provided with connecting means for connecting to the electrode, the connecting means being provided with elastic contacts that allow the connecting means to be connected to and disconnected from the electrode freely, and external contactors conductively connected to the connecting means in a continuous manner and disposed on a second side of the sheet, the second side being opposite each of the mounting portions, and a second step of receiving an externally input electrical signal and performing a matching test between the plurality of electronic components.

According to the first aspect of the present invention, an electronic component, such as a bare chip, is freely removable from the holder. Therefore, only an electronic component that has been determined to be defective can be discarded, thus preventing a good electronic component from being discarded together.

According to the second aspect of the present invention, a connection between electrodes can be established reliably, and the height of the elastic contact can be suppressed. This can reduce the thickness of the electronic module.

According to the third aspect of the present invention, even if an electronic component (e.g., bare chip) is difficult to work with because the pitch between electrodes is small, the electronic component is constructed as an electronic module in which the pitch is enlarged due to re-routing. Therefore, it can be handled easily.

According to the fourth aspect of the present invention, electronic components that have different heat values can be mounted in a single holder.

According to the fifth aspect of the present invention, an electronic component can be secured to the holder merely by being heated after the test ends. Therefore, the electronic component can be secured while a good connection between an electrode of the electronic component and that of the holder is maintained.

According to the seventh aspect of the present invention, an electronic module that has a high yield as a unit can be used. Therefore, a stacked module can have a high degree of reliability.

According to the eighth and tenth aspects of the present invention, a matching test can be performed during a manufacturing process. Therefore, the yield of electronic modules can be improved.

According to the ninth aspect of the present invention, unlike the known art, an electronic component that has been determined to be defective when used with a bare chip but is a good module when used with another bare chip is not discarded. As a result, electronic components can be used efficiently.

According to the eleventh aspect of the present invention, an electronic component, such as a bare chip or electronic module, is freely removable from the holder. Therefore, only an electronic component that has been determined to be defective can be discarded, thus preventing a good electronic component from being discarded together.

According to the twelfth aspect of the present invention, a connection between electrodes can be established reliably, and the height of an elastic contact can be suppressed. This can reduce the thickness of, in particular, a laminate electronic-module structure.

According to the thirteenth aspect of the present invention, only an electronic component in one mounting portion is required for a directly electrical connection, and other mounting portions can be connected via wiring patterns. Therefore, the number of terminals required for external connections can be reduced, and a laminate electronic-module structure can be formed.

According to the fourteenth aspect of the present invention, a plurality of electronic components can be stacked by stacking them in one direction. Therefore, a laminate electronic-module structure can be formed easily.

According to the fifteenth aspect of the present invention, a mounting portion and a folding portion can be distinguished clearly.

According to the sixteenth aspect of the present invention, a laminate electronic-module structure can be formed easily, and electronic components at different layers can be electrically connected to each other with reliability.

According to the seventeenth aspect of the present invention, an electronic component can be secured to the holder merely by being heated after the test ends. Therefore, the electronic component can be secured while a good connection between an electrode of the electronic component and that of the holder is maintained.

According to the eighteenth and twenty-first aspects of the present invention, a matching test can be performed during a manufacturing process. Therefore, the yield of electronic modules can be improved.

According to the nineteenth aspect of the present invention, a laminate electronic-module structure can be manufactured easily.

According to a twentieth aspect of the present invention, unlike the known art, an electronic component that is determined to be defective when used in a combination but is a good module when used in another bare chip is not discarded. As a result, electronic components can be used efficiently.

DESCRIPTION OF THE PREFERRED EMBODIMENTS

Figure 1:
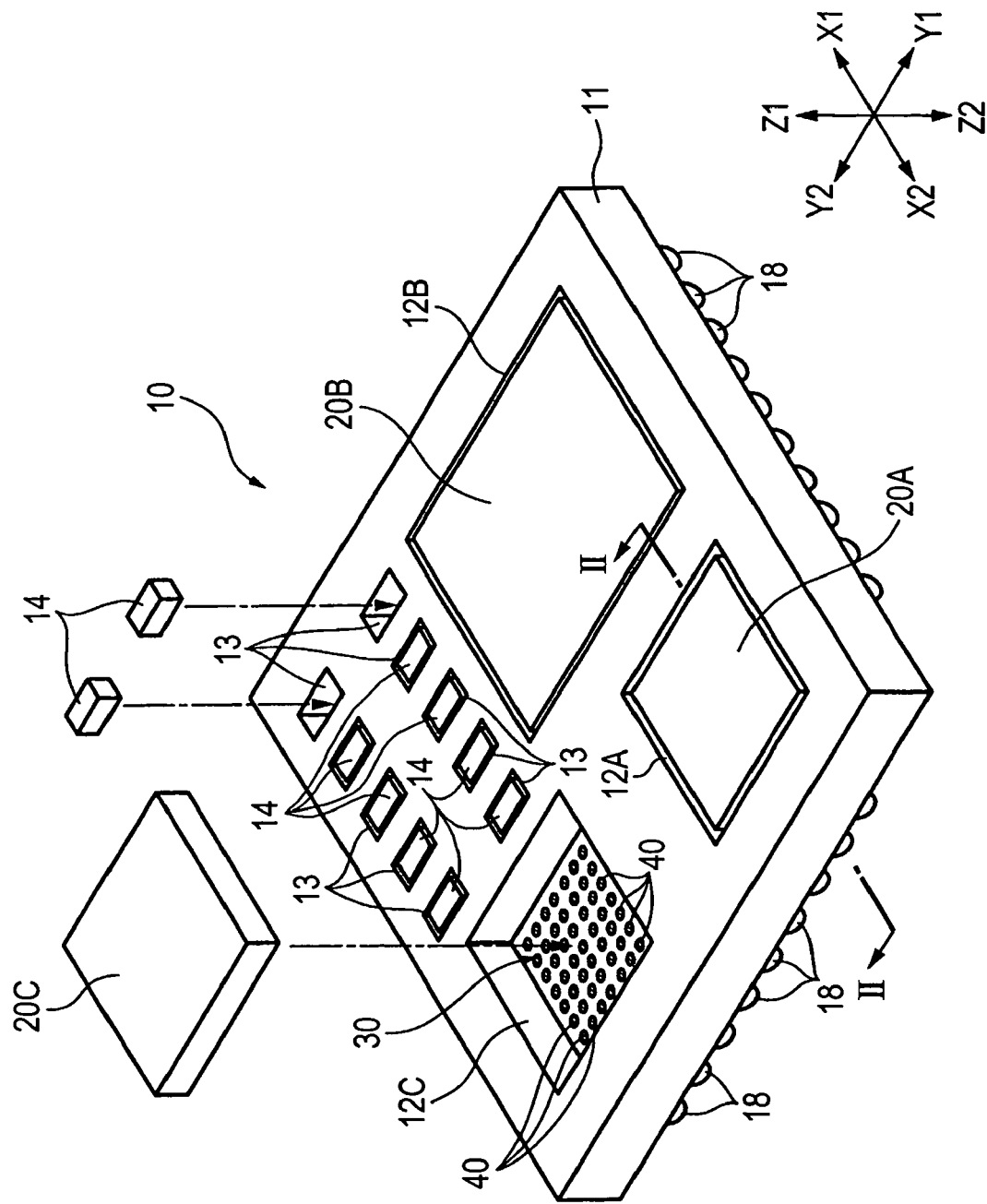
FIG. 1 is a perspective view of an electronic module according to a first embodiment of the present invention.
Figure 2:
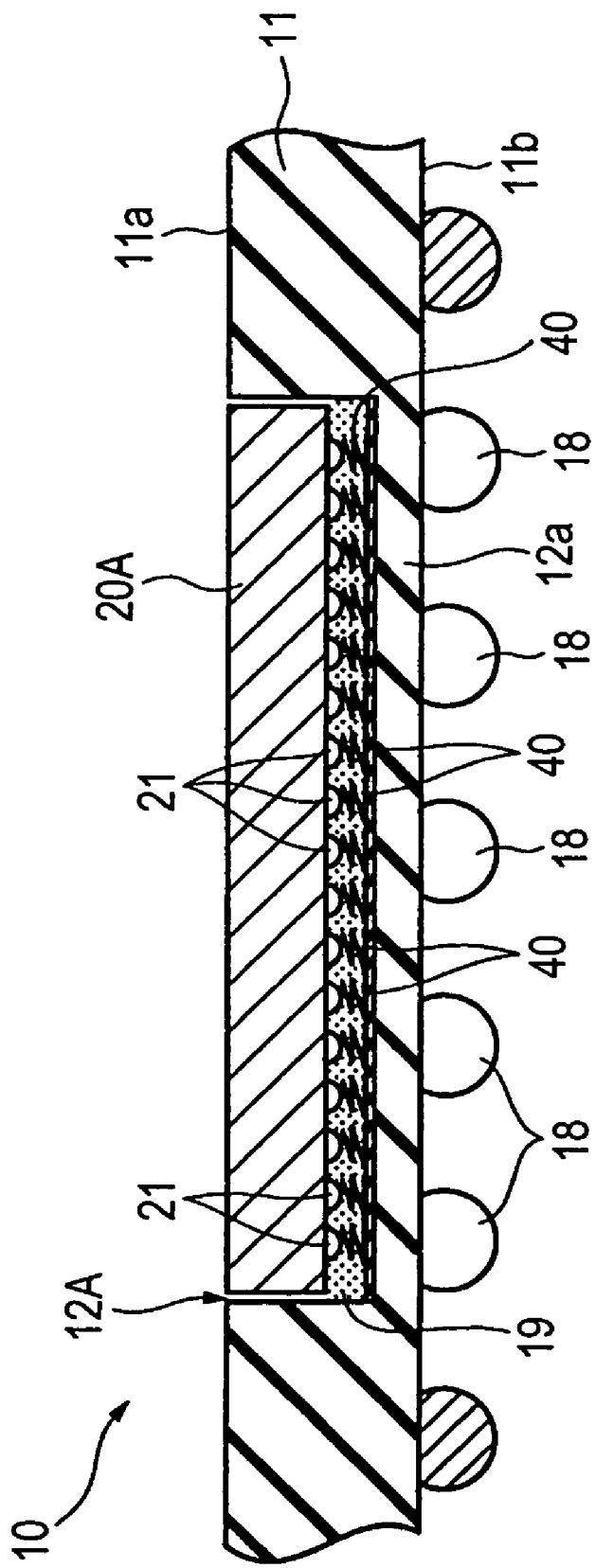
FIG. 2 is a partial sectional view of the electronic module taken along the line II-II in FIG. 1.
Figure 3:
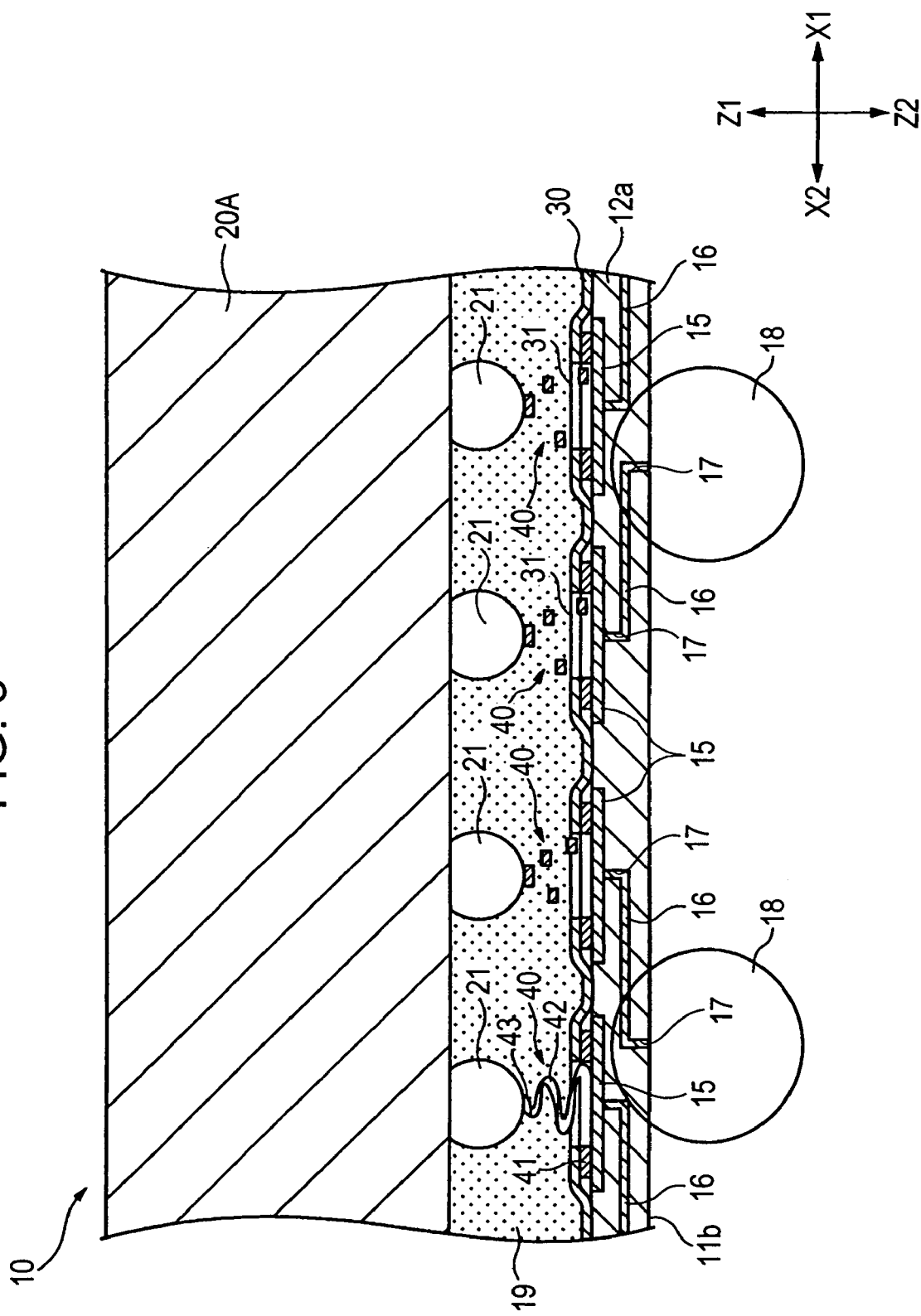
FIG. 3 is a sectional view that is partially enlarged from FIG. 2.

FIG. 1 is a perspective view of an electronic module according to a first embodiment. FIG. 2 is a partial sectional view of the electronic module taken along the line II-II in FIG. 1. FIG. 3 is a sectional view that is partially enlarged from FIG. 2.

Referring to FIG. 1, an electronic module 10 includes a holder 11. The holder 11 is made from an insulating synthetic resin and includes one or more (e.g., three) cavities 12 (individually indicated by reference numerals 12A, 12B, and 12C) and a plurality of apertures 13.

The cavities 12 (12A, 12B, and 12C) are used for mounting one or more bare chips (electronic components) 20 (individually indicated by reference numerals 20A, 20B, and 20C). The apertures 13 are used for mounting other electronic components 14, such as resistors, capacitors, and the like.

The bare chip 20A is typically used for a central processing unit (CPU), a memory, a thermal head, or a charge-coupled device (CCD). Each of the bare chips 20 is separated from a wafer so as to be several millimeters on each side. On a lower surface of the bare chip 20, a plurality of electrodes including spherical contactors (ball grid array (BGA)), as shown in FIG. 2, or planer contactors (land grid array (LGA)), not illustrated, are arranged. The spherical contactors 21 or planar contactors are regularly arranged in a matrix over the lower surface of the bare chip 20 or in lines at the edge on the lower surface of the bare chip 20. The pitch distance between the spherical contactors 21, W1, is approximately 40 μm.

A plurality of planar electrodes 15 are arranged on a bottom portion 12a in the cavity 12A in the holder 11. Hereinafter, the explanation of the cavity 12A is applied to the cavities 12B and 12C unless otherwise specified.

The bottom portion 12a has a multilayer substrate structure, and each layer includes a wiring pattern 16 formed on an upper or lower surface thereof. The wiring patterns 16 of the layers are connected to each other with plated through holes 17 which extend vertically. External contactors 18 which are typically a matrix of spherical contactors are disposed on a lower surface 11b of the holder 11, the lower surface 11b being the back surface of the bottom portion 12a.

The planar electrodes 15 in the cavity 12 are connected to the external contactors 18 with the wiring patterns 16 and the plated through holes 17 disposed therebetween. The pitch distance between the external contactors 18, W2, is set so as to be in the range of 100 μm to 1000 μm.

The external contactors 18 are not limited to spherical contactors (BGA). The external contactors 18 may be planer electrodes (LGA), cone-shaped contactors (cone grid array (CGA)), or pin contactors (pin grid array (PGA)).

Hereinafter, the holder 11 in which the bare chips 20 and the other electronic components 14, such as resistors, capacitors, and the like, are mounted and packaged is referred to as an electronic module, and a lamination in which holders formed as electronic modules are stacked is referred to as a stacked module.

The electronic module using the holder for an electronic component described above and a method for manufacturing the electronic module are described below.

The holder 11 includes a contact sheet 30 secured to the front surface of the bottom portion 12a. The contact sheet 30 is typically made of a polyimide with excellent insulation properties. The contact sheet 30 includes a plurality of openings 31 disposed at the pitch W1. At the edge of each of the openings 31, an elastic contact functioning as connecting means is secured.

The elastic contact is preferably a spiral contactor 40, as shown in the present embodiment. However, the elastic contact may be an extendable contact probe (see, for example, Japanese Unexamined Patent Application Publication No. 2002-357622).

The spiral contactor 40 has a frame-shaped base portion 41 disposed in the outer region and a transformable portion 42 extending spirally from the base portion 41 toward the center. The transformable portion 42 has a leading end 43 at its leading end. The transformable portion 42 in the spiral contactor 40 extends from the base portion 41 such that one end of the transformable portion 42 is secured. The transformable portion 42 is elastically deformable vertically (in the Z1 and Z2 direction).

In FIG. 3, the base portions 41 of the spiral contactors 40 are secured at the edges of the corresponding openings 31 below the contact sheet 30 with adhesives. The transformable portion 42 has a three-dimensional shape that protrudes in the Z1 direction. Therefore, the leading end 43 extends through the openings 31 in the Z1 direction.

The contact sheet 30 is secured to the front surface of the bottom portion 12a such that the base portions 41 of the spiral contactors 40 are opposed to the corresponding planar electrodes 15 within the cavities 12. The base portions 41 of the spiral contactors 40 are connected to the corresponding planar electrodes 15 with conductive adhesives disposed therebetween. Therefore, the spiral contactors 40 are conductively connected to the corresponding external contactors 18 via the planar electrodes 15, wiring pattern 16, and plated through holes 17.

The bare chips 20A, 20B, and 20C, which constitute a set of electronic components, are mounted in the cavities 12A, 12B, 12C, respectively. At this time, as shown in FIG. 3, the spherical contactors (electrodes) 21 of the bare chip 20A are in elastic contact with the corresponding leading ends 43 of the spiral contactors 40. Therefore, the spherical contactors 21 of the bare chip 20A are electrically conductively connected to the corresponding external contactors 18.

If the bare chip 20A is removed from the cavity 12A, the spherical contactors (electrodes) 21 of the bare chip 20A are easily separated from the corresponding spiral contactors 40. In other words, the bare chip 20A is freely removable from the cavity 12A. The same applies to the other bare chips 20B and 20C.

The pitch distance W2 between the external contactors 18 is set so as to be in a range of 2.5 to 10 times the pitch distance W1 between the spherical contactors 21 of the bare chip 20A. As a result, the holder 11 has a re-routing function of extending the narrow pitch distance W1 in the bare chip 20A to the wider pitch distance W2.

An adhesive member 19 which is made of a nonconductive paste (NCP), a nonconductive film (NCF), or nonoductive material, is disposed between the lower surface of the bare chip 20A and the front surface of the contact sheet 30, so that the bare chip 20A is secured in the cavity 12 via the adhesive member 19. Preferably, the adhesive member 19 may have thermosetting or thermoplastic properties, in addition to nonconductive properties.

Securing using the adhesive member described above is apt to be a semipermanent connection because a surface metal connection between a metal pad on the device and the surface of an elastic contact is prone to be produced. As a result, a mechanically and electrically stable connection can be realized easily.

Similarly, the bare chips 20B and 20C are secured in the cavities 12B and 12C, respectively. Additionally, the other electronic components 14 are secured in the apertures 13 (e.g., resistors and capacitors). Lastly, an insulating resin material or other material is injected into the cavities 12 and the apertures 13, and then, the packaged electronic module 10 is complete.

As described above, a set of electronic components, including bare chips that constitute a central processing unit (CPU), memory (e.g., random-access memory (RAM) and read-only memory (ROM)), and the like, and other electronic components, are incorporated in the plurality of cavities 12 and apertures 13, thus manufacturing the electronic module 10 which is called a multi chip module (MCM). The holder 11 may include a single cavity 12, in place of a plurality of cavities 12, and the electronic module 10 may be provided with a single bare chip 20 mounted in the cavity 12.

Second Embodiment

Figure 4:
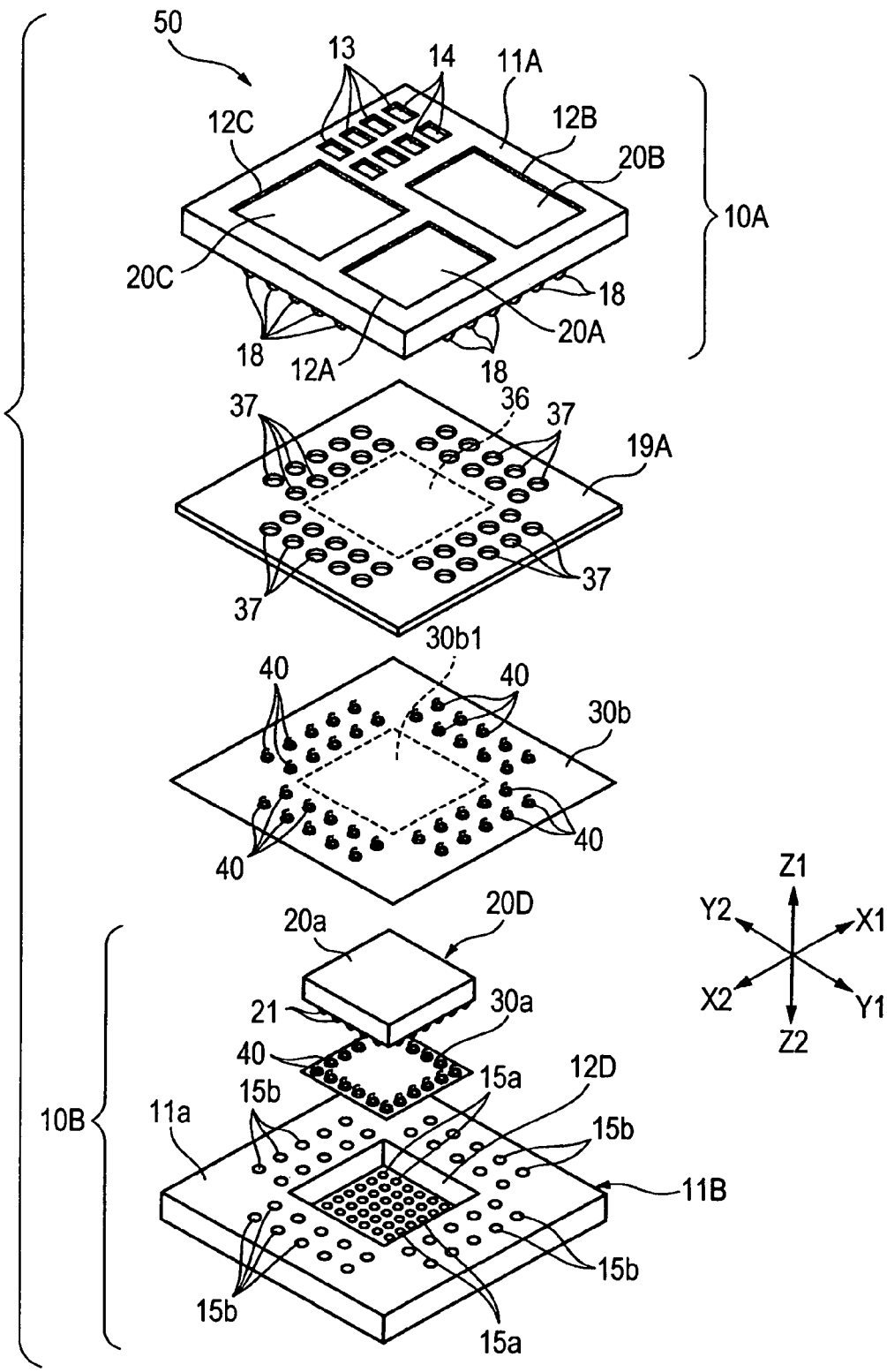
FIG. 4 is a disassembled perspective view of a lamination of electronic modules (stacked module) according to a second embodiment of the present invention.

FIG. 4 is a disassembled perspective view of a lamination of electronic modules (stacked module) according to a second embodiment.

As shown in FIG. 4, a stacked module (lamination of electronic modules) 50, in which a plurality of holders 11, each holder being included in an electronic module 10 which has been described above, are stacked vertically (in the Z direction), can be manufactured. The stacked module and a method for manufacturing the stacked module are described below.

The stacked module (lamination of electronic modules) 50 includes a first electronic module 10A including a holder 11A in which bare chips 20A, 20B, and 20C and a plurality of other electronic components 14 are mounted at the highest layer and a second electronic module 10B including another holder 11B at the lowest layer. The number of stacked layers in the stacked module 50 is not limited to two, as shown in FIG. 4. The number of stacked layers in the stacked module 50 may be three or more.

The lower holder 11B shown in the present embodiment includes a single cavity 12D at the center thereof. Circular planar electrodes 15a are arranged in a matrix on a bottom portion 12a within the cavity 12D, as in the foregoing. Additionally, the lower holder 11B is provided with planar electrodes 15b arranged in two rows in the X and Y directions on an upper face 11a thereof around the cavity 12D.

Within the cavity 12D, a first contact sheet 30a is secured, as in the foregoing. The first contact sheet 30a is provided with a plurality of spiral contactors 40, as in the foregoing. The spiral contactors 40 include base portions 41 and leading ends 43. The base portions 41 are connected to the corresponding planar electrodes 15a. Each of the spiral contactors 40 is formed such that the leading end protrudes in the Z1 direction.

The cavity 12D including the first contact sheet 30a mounts a bare chip 20D therein. Spherical contactors 21 arranged on the bottom surface of the bare chip 20D are in elastic contact with the corresponding leading ends 43. The bare chip 20D is adhesively secured to the first contact sheet 30a with a nonconductive paste (NCP) (not illustrated) disposed therebetween.

Preferably, the thickness of the upper face 11a of the lower holder 11B may be set so as to allow that, when the bare chip 20D is mounted in the cavity 12D, the upper face 11a of the lower holder 11B is flush with an upper surface 20a of the bare chip 20D so that the upper face 11a and the upper surface 20a form the same plane. According to this arrangement, the upper holder 11A can be stacked above the lower holder 11B.

Between the upper holder 11A and the lower holder 11B, a second contact sheet 30b and a nonconductive film (NCF) 19A in the form of a sheet are disposed. The nonconductive film 19A can function as an adhesive member by being heated. The second contact sheet 30b includes an empty space 30b1 opposed to the cavity 12D in the lower holder 11B at the center thereof. The second contact sheet 30b is provided with the spiral contactors 40, which is similar to those described above, opposed to the corresponding planar electrodes 15b on the outer areas of the second contact sheet 30b other than the empty space 30b1. The second contact sheet 30b is secured to the lower holder 11B. The base portions 41 of the spiral contactor 40 disposed on the second contact sheet 30b are connected to the corresponding planar electrodes 15b on the lower holder 11B with conductive adhesives, as in the foregoing.

The nonconductive film 19A includes an empty space 36 opposed to the cavity 12D at the center thereof. The nonconductive film 19A is provided with a plurality of small holes 37 opposed to the corresponding spiral contactors 40 disposed on the second contact sheet 30b in the outer areas of the nonconductive film 19A other than the empty space 36. The diameter of each of the small holes 37 is greater than that of each of the spiral contactors 40. The leading ends 43 of the spiral contactors 40 pass through the small holes 37 and protrude in the Z1 direction.

After the second contact sheet 30b is stacked on top of the lower holder 11B, the nonconductive film 19A is stacked on top of the stacked structure. Subsequently, the upper holder 11A is stacked on top of the stacked structure, so that the upper holder 11A is at the highest layer. Therefore, the stacked module 50 is formed by securing the upper holder 11A, which is at the highest layer, and the lower holder 11B in this stacked state.

Before the upper holder 11A, which is at the highest layer, and the lower holder 11B are secured, a predetermined test is performed for each holder. The stacked module 50 is modularized by using only the holder 11A and the lower holder 11B that have passed testing. This can maintain the high quality of the manufactured stacked module 50, thus increasing the reliability of the stacked module 50.

Figure 5:
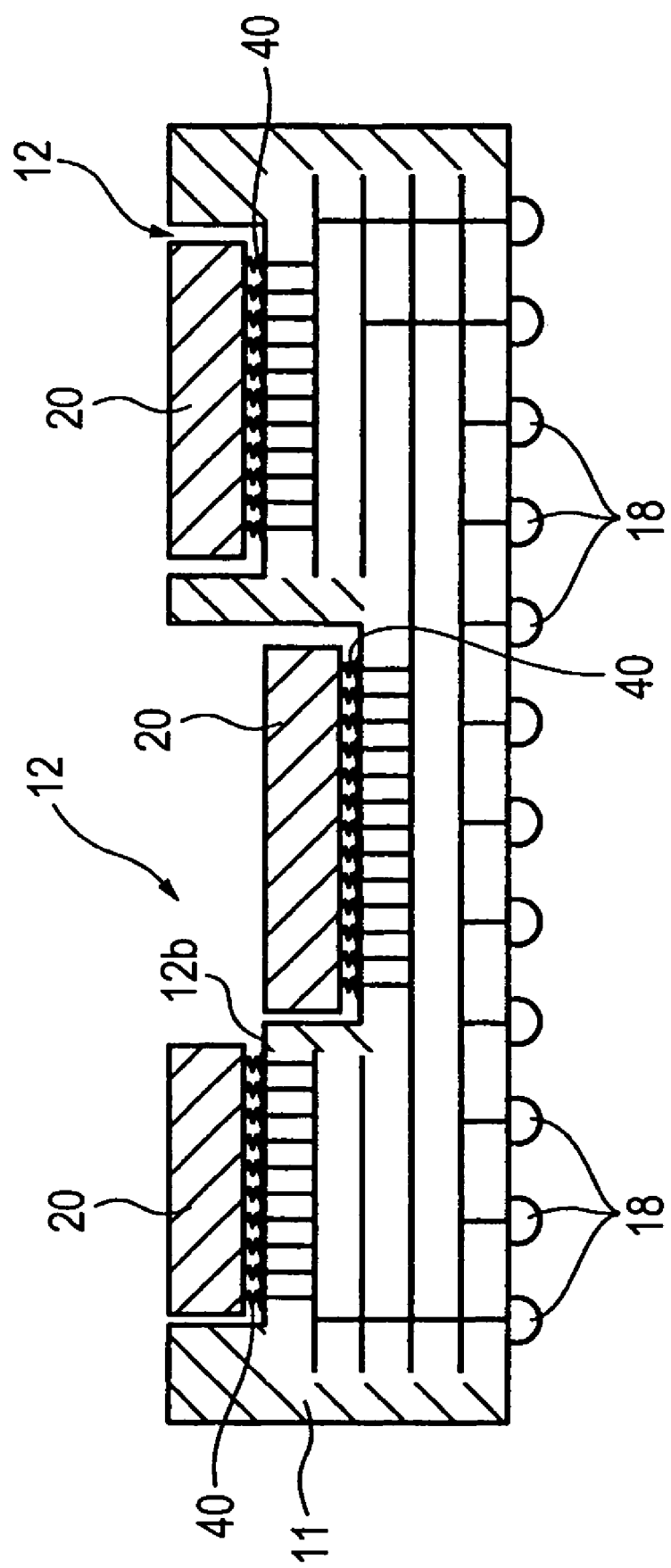
FIG. 5 is a sectional view of an electronic module with a holder including a stepped portion.

FIG. 5 is a sectional view of an electronic module with a holder including a stepped portion.

As shown in FIG. 5, in the case of an electronic module including a set of electronic components, such as a plurality of bare chips, mounted within the holder 11, the electronic components may be individually arranged on one or more stepped portions 12b formed in the cavity 12. In this arrangement, if a first electronic component that has a higher heat value (e.g., CPU or a memory) is arranged at an upper layer and a second electronic component that has a lower heat value is arranged at a lower layer, the second electronic component with a lower heat value can be protected from the first electronic component with a higher heat value.

Figure 7:
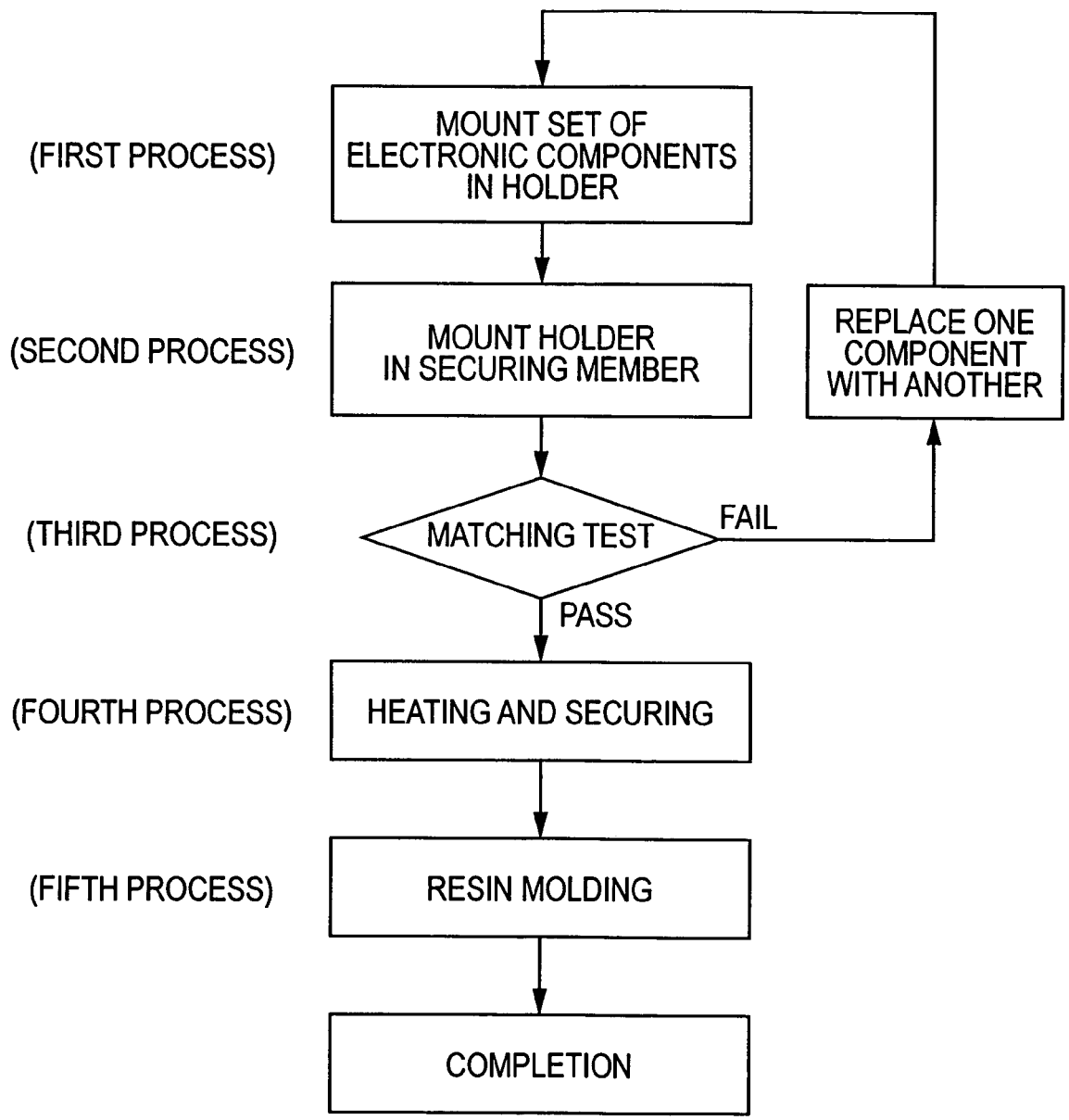
FIG. 7 is a flowchart of a process of manufacturing the electronic module as a manufacturing method according to the present invention.

A method for manufacturing such an electronic module, in which a set of electronic components is mounted, is described below with reference to FIG. 7. FIG. 7 is a flowchart of a process of manufacturing the electronic module as a manufacturing method according to the present invention.

In the first manufacturing process, a set of electronic components which are a combination of at least two electronic components included in an electronic module that is to be tested are mounted in the holder 11.

In the second manufacturing process, the holder 11 is mounted in a securing member (substrate such as a socket) 60, which is described below.

Figure 6:
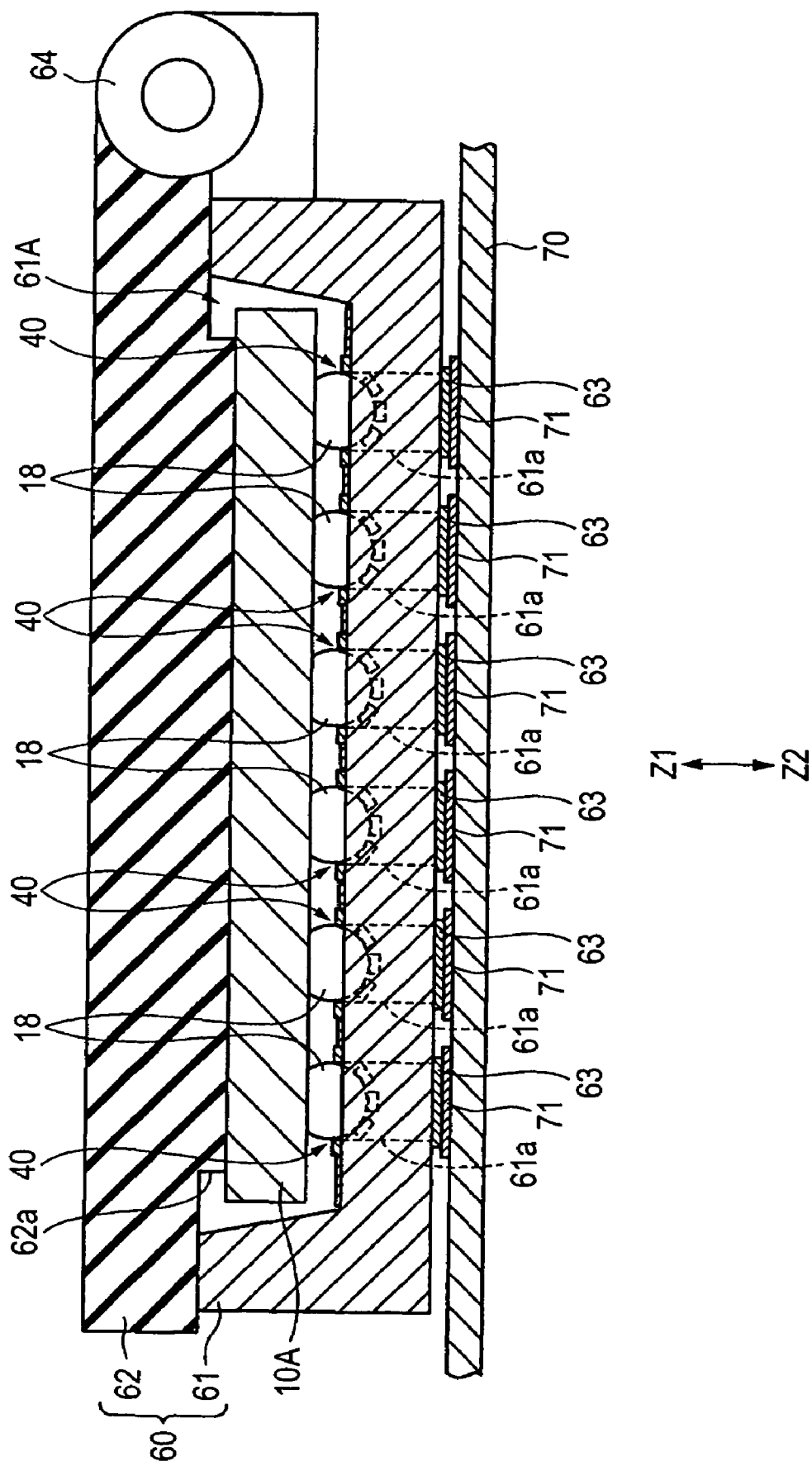
FIG. 6 is a sectional view of a securing member within which the holder is held.

FIG. 6 is a sectional view of a securing member within which the holder is held.

As shown in FIG. 6, the securing member 60 includes a base 61 and a lid 62 pivotally supported by the base 61 with a hinge 64 disposed at a first end of the base 61. Each of the base 61 and lid 62 is typically made of a resin that has both heat-resisting and insulating properties. At the central area of the base 61, a mounting portion 61A which is concave in the Z1 direction is disposed. The electronic module 10 can be mounted in the mounting portion 61A.

The mounting portion 61A is provided with a plurality of through holes 61a which have a predetermined diameter and pass through the base 61 from the front surface of the mounting portion 61A to the back surface of the base 61. The through holes 61a are arranged so as to correspond to the plurality of external contactors 18 disposed on a connection face (a face in the Z2 direction) of the electronic module 10.

On the upper portion of the through holes 61a (front surface of the mounting portion 61A), spiral contactors 40 functioning as elastic contacts are disposed. These spiral contactors 40 differ from the spiral contactor 40 described above in that each of these spiral contactors 40 is formed such that a base portion 41 is flush with a transformable portion 42 which inwardly extends in a spiral manner, i.e., does not have a three-dimensional convex shape. These spiral contactors 40 are the same as the spiral contactors 40 described above in that the transformable portions 42 are elastically deformable vertically (Z1 and Z2 directions).

As shown in FIG. 6, under the base 61, a printed board 70 for testing which has a plurality of wiring patterns and other circuit parts is disposed. The base 61 is secured on the printed board 70. The front surface of the printed board 70 is provided with wiring patterns including opposing electrodes 71 which are opposed to connection terminals 63 arranged on the bottom surface of the base 61. The connection terminals 63 are connected to the corresponding opposing electrodes 71 with conductive adhesives, soldering, or other means.

The lid 62 is provided with a convex pressing portion 62a for pressing the electronic module 10 downwardly at the central portion of the inner face of the lid 62. The pressing portion 62a is opposed to the mounting portion 61A.

Between the inner face of the lid 62 and the pressing portion 62a, an urging member for urging the pressing portion 62a in a direction that is remote from the inner face is disposed (not illustrated). The urging member is typically a coil spring. Therefore, when the lid 62 is closed after the electronic module 10 is mounted in the mounting portion 61A, the electronic module 10 can be elastically urged in the Z2 direction, i.e., toward the inside of the mounting portion 61A.

A locking mechanism (not illustrated) for maintaining such a pressed state is disposed between the lid 62 and the base 61.

The size of the mounting portion 61A of the base 61 is substantially the same as that of the outer shape of the electronic module 10. When the lid 62 is locked with respect to the base 61 after the electronic module 10 is mounted in the mounting portion 61A, the electronic module 10 can be positioned in the mounting portion 61A, and at the same time, the external contactors 18 disposed on the connection face of the electronic module 10 can be accurately opposed to the corresponding spiral contactors 40 disposed on the inner surface of the mounting portion 61A.

When the lid 62 is locked with respect to the base 61, the electronic module 10 is urged downwardly in FIG. 6. As a result, the external contactors 18 come into contact with the corresponding spiral contactors 40, and the spiral contactors 40 are pressed in a direction adjacent to inner portion of the through holes 61a (the Z2 direction). At this time, the outer shape of each of the transformable portions 42 of the spiral contactors 40 is deformed so as to stretch from the center toward the outside. Therefore, the transformable portions 42 are wound around the corresponding external contactors 18 so as to catch the external surfaces of the external contactors 18. As a result, the external contactors 18 are electrically connected to the corresponding spiral contactors 40 in a reliable manner.

In this way, the electronic module 10A is mounted in the mounting portion 61A in the securing member 60. In the third manufacturing process, a matching test between the bare chips 20A, 20B, and 20C, which constitute a set of electronic components in the electronic module 10A, is performed by externally inputting an electrical signal to the external contactors 18 on the electronic module 10A. The matching test includes various tests. Examples of the matching test include a test for continuity, a test for impedance matching, a test for on-resistance measurement between terminals, a leakage current test, and a combination thereof.

In the fourth manufacturing process, an electronic module 10A that has passed testing is sent to a heating process and is heated for a predetermined period of time at a predetermined temperature. At this time, the adhesive member 19 disposed between the lower surface of the bare chip 20A and the front surface of the contact sheet 30 becomes hard and rigid by being heated, thus securing the bare chip 20A on the bottom portion 12a within the cavity 12A. In this process, the application of pressure may be used, if necessary.

When the electronic module 10A stays in the securing member 60 after being heated, the distance between the bare chip 20A and the bottom portion 12a in the cavity 12 can be reduced due to the heat shrinkage of the adhesive member 19. Therefore, a good connection can be set in which the spherical contactors 21 of the bare chip 20 are continuously in contact with the corresponding spiral contactor 40 on the holder 11.

In the fifth manufacturing process, the overall electronic module 10 is resin-molded. Therefore, the electronic module 10 is manufactured as a product, such as a LSI, MCM, or the like. The electronic module 10 is shipped as a known good die (KGD).

In the third manufacturing process, if the result of the test is fail, processing goes back to the first manufacturing process. One of the set of electronic components, for example, the bare chip 20A is removed from the holder 11 and replaced with a new bare chip 20A. Subsequently, the second manufacturing process is performed, and in the third manufacturing process, the matching test is carried out again.

If the electronic module 10A including a new set of electronic components pass re-testing, the bare chip 20A is secured on the bottom portion 12a within the cavity 12 and is then resin-molded in the fourth manufacturing process. The removed bare chip 20A is discarded because the probability is high that it has been a defective. Alternatively, the removed bare chip 20A may be sent to a through inspection process.

If the result of the retest is fail, the probability is high that another bare chip has been a defective. Therefore, the bare chip 20B is removed from the holder 11, for example, a new bare chip 20B is mounted, and then, a test that is similar to the foregoing. If the new electronic module 10A has passed retesting, the electronic module 10A is secured in the heating process, which is described above, and is then resin molded.

As described above, according to the present invention, a test for a bare chip can be performed, which is not performed in the known art. As a result, only a combination of bare chips that have passed testing can be manufactured as a product, and this can improve the yield (the ratio of the number of products other than defectives to the total number of products manufactured in a manufacturing line) of the electronic module 10 as a unit. Therefore, the yield of the stacked module 50, in which a plurality of electronic modules 10 with reduced rejection rates are stacked, can also be improved.

Additionally, even if a first bare chip is determined to be defective when used with a second bare chip, the first bare chip can be tested for the possibility that the first bare chip is good when being used with a third bare chip. Therefore, only a bare chip that has been finally determined to be defective can be discarded, so that the number of discarded bare chips can be reduced. As a result, the yield of bare chips can be improved.

Third Embodiment

Figure 8:
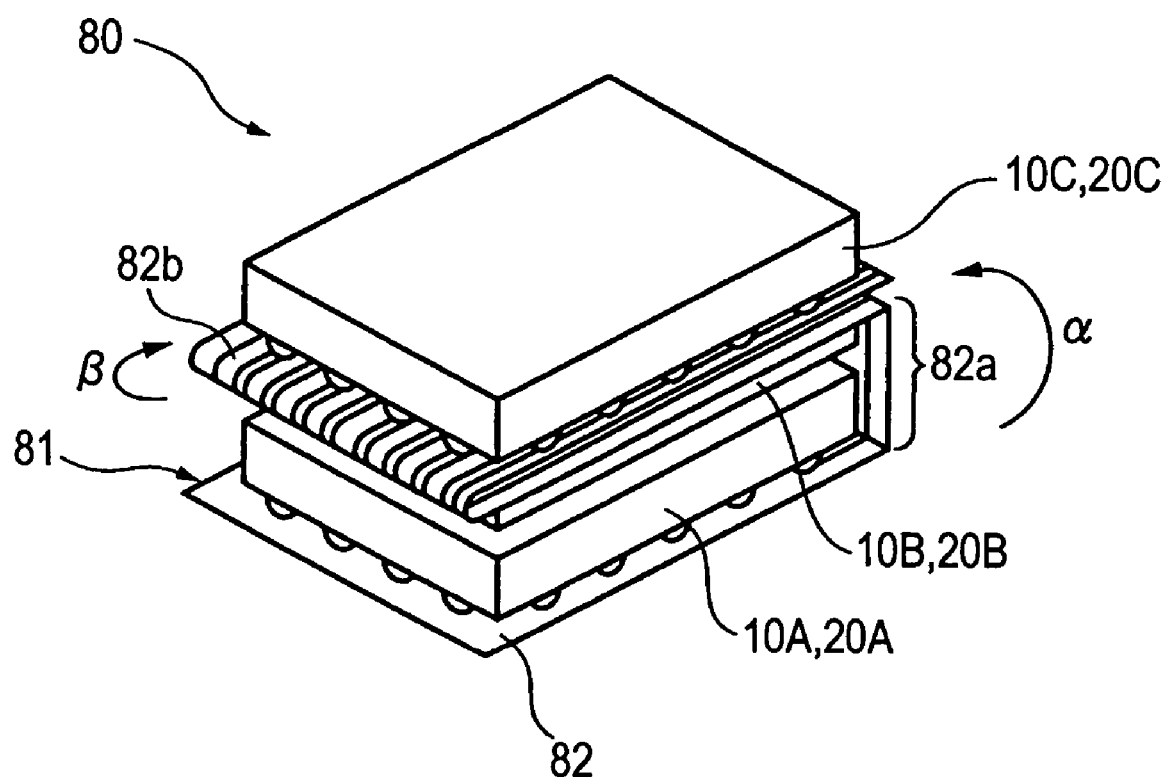
FIG. 8 is a perspective view of a laminate electronic-module structure according to a third embodiment of the present invention.
Figure 9:
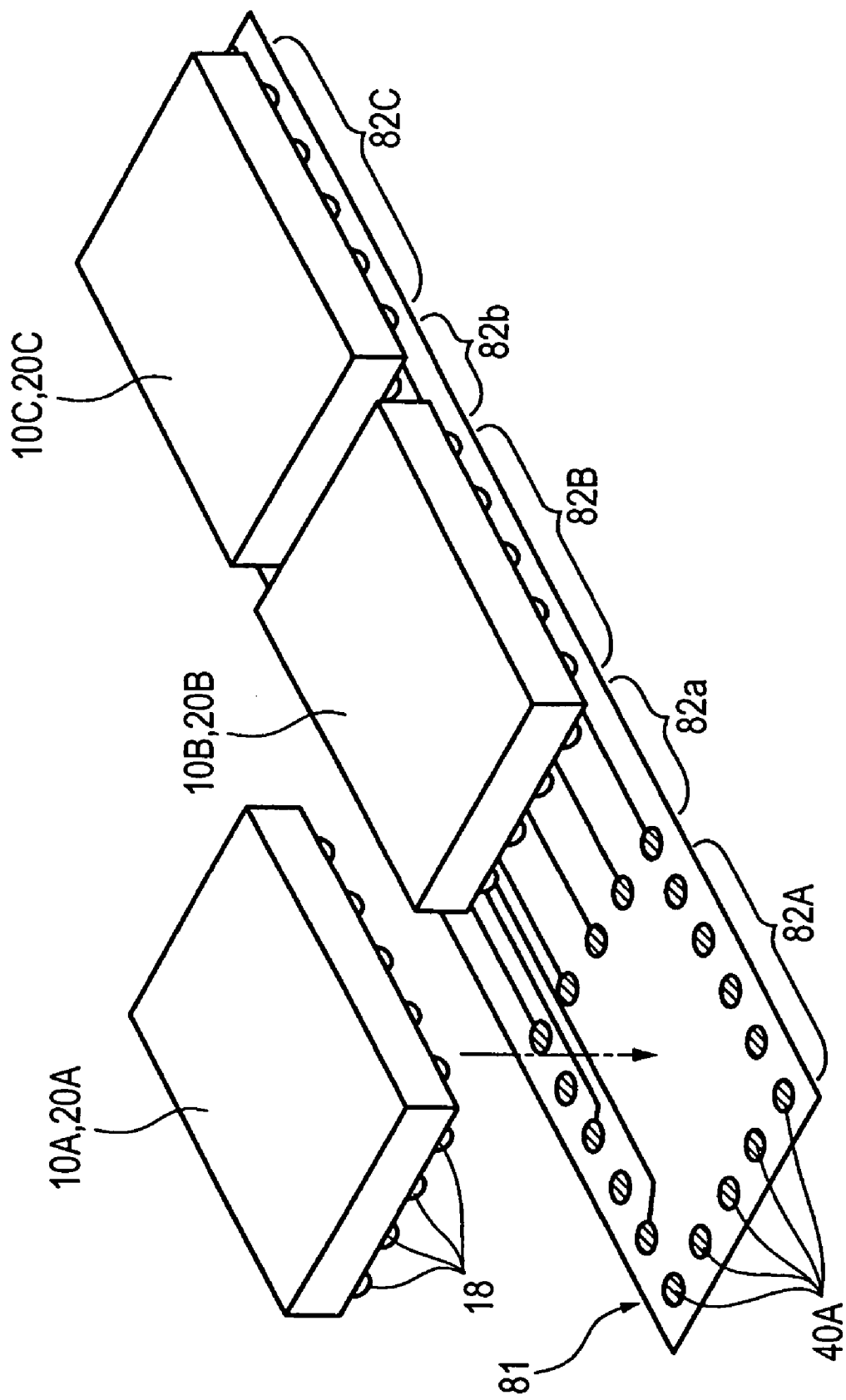
FIG. 9 is a perspective view of the a laminate electronic-module structure before stacking is performed.
Figure 10:
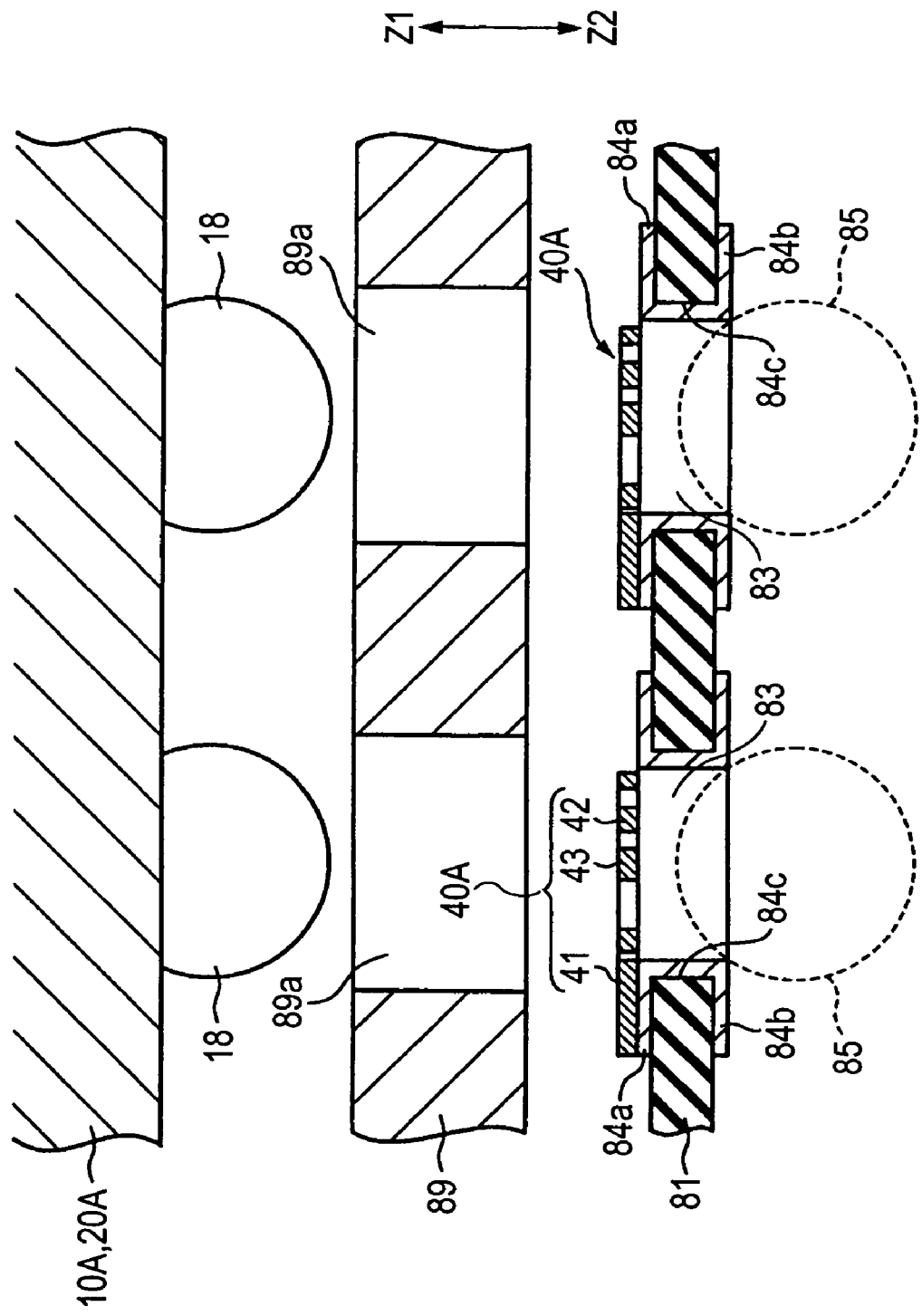
FIG. 10 is a partial enlarged sectional view of a connection portion in the laminate electronic-module structure before the connection is completed.
Figure 11:
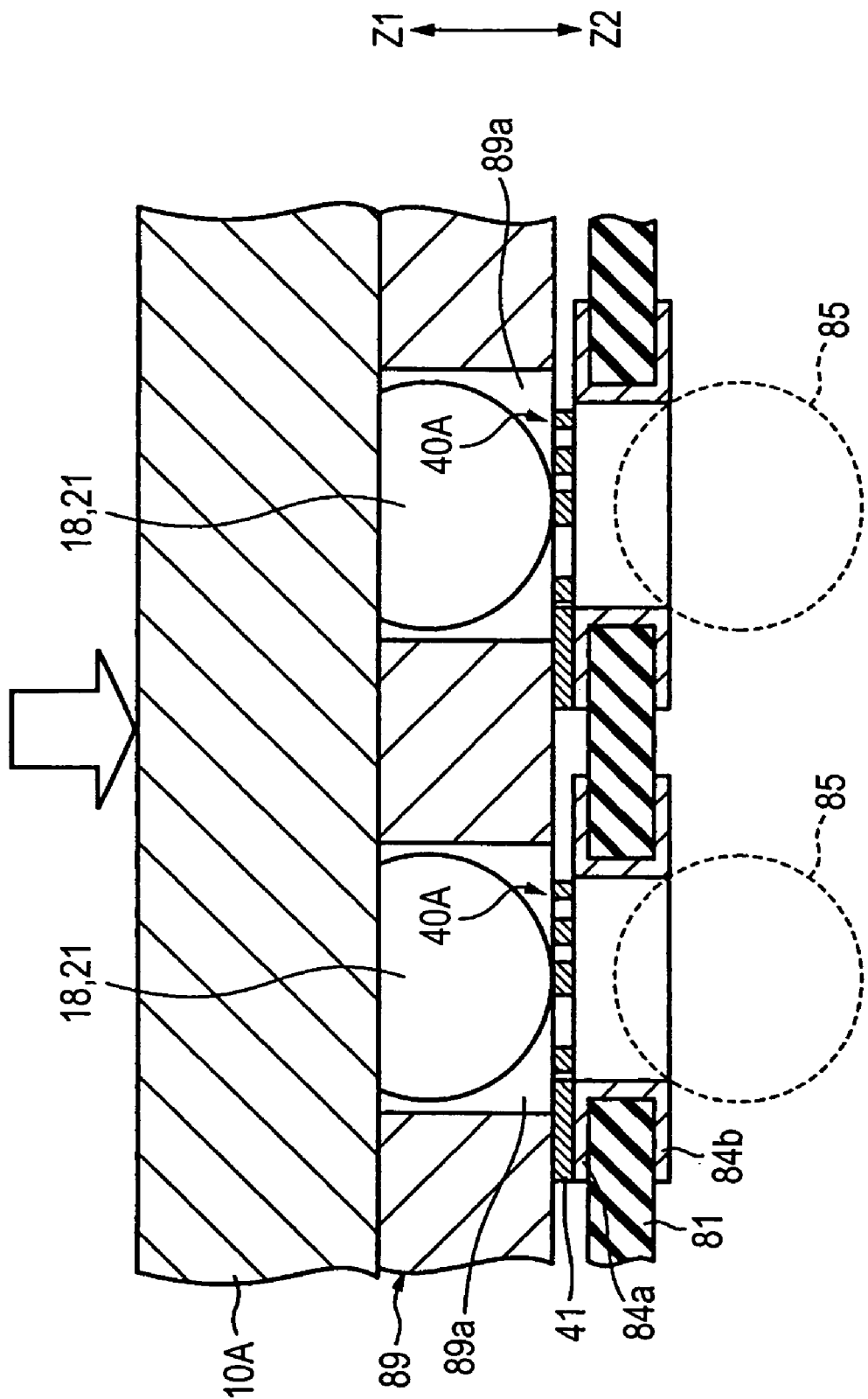
FIG. 11 is a partial enlarged sectional view of the connection portion in the laminate electronic-module structure at a temporarily attached state before the laminate electronic-module structure is heated.
Figure 12:
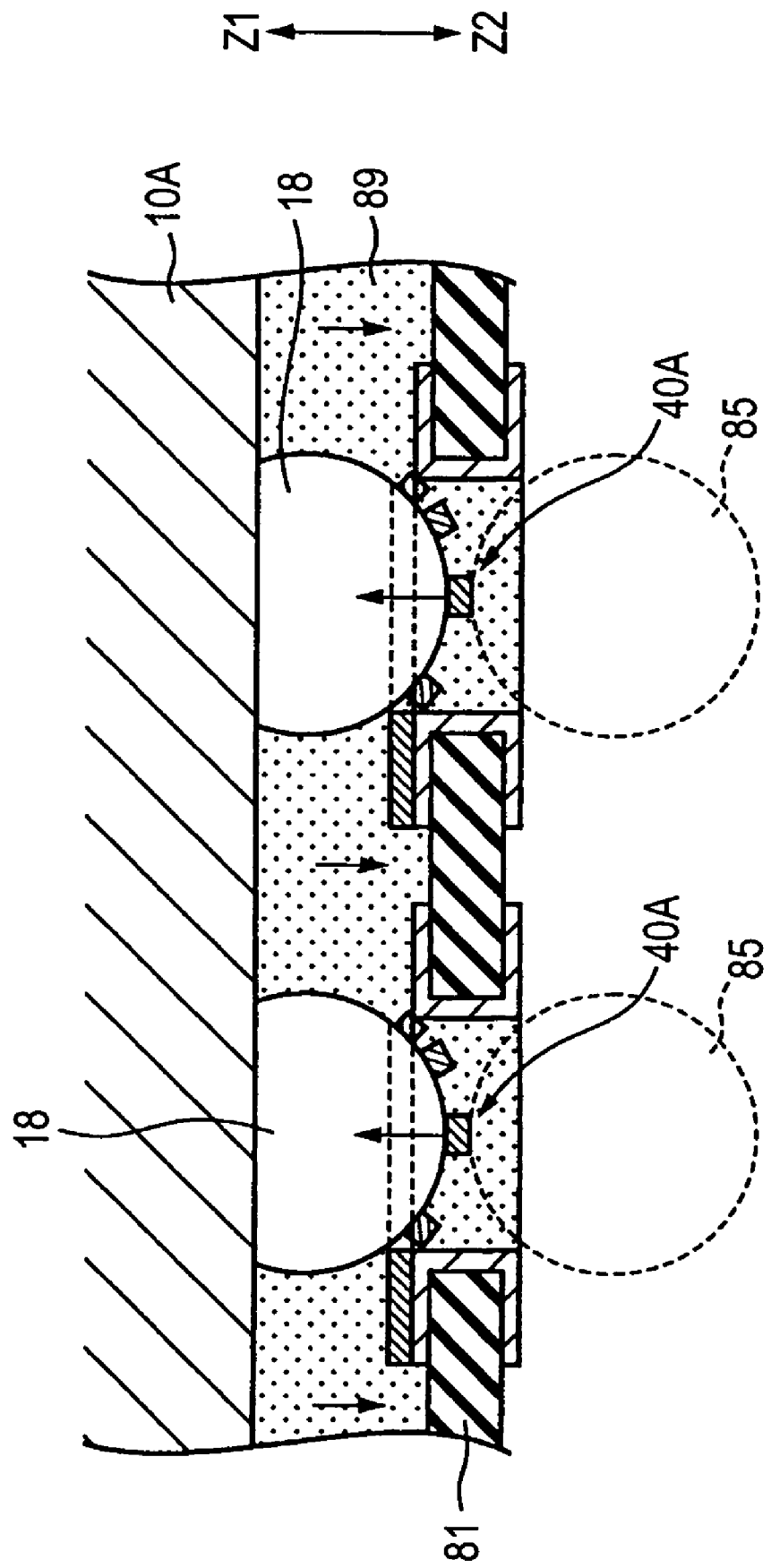
FIG. 12 is a partial enlarged sectional view of the connection portion in the laminate electronic-module structure at a connected state after the laminate electronic-module structure is heated.
Figure 13:
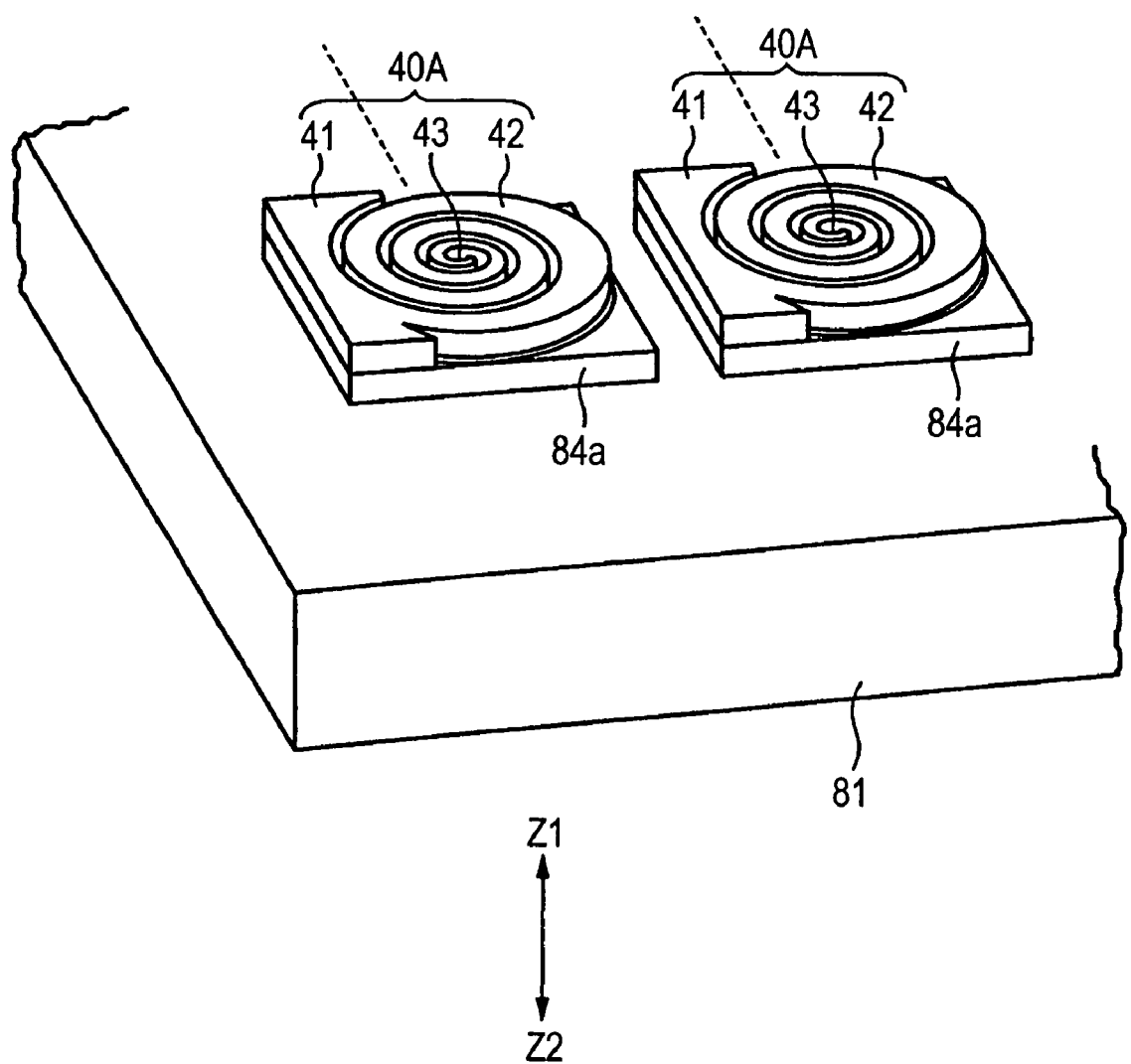
FIG. 13 is a perspective view of a spiral contactor.

FIG. 8 is a perspective view of a laminate electronic-module structure according to a third embodiment of the present invention. FIG. 9 is a perspective view of the laminate electronic-module structure before stacking is performed. FIGS. 10 to 12 are partial enlarged sectional views of a connection portion of the laminate electronic-module structure. FIG. 10 illustrates the connection portion at an unconnected state before the connection is completed. FIG. 11 illustrates the connection portion at a temporarily attached state before the laminate electronic-module structure is heated. FIG. 12 illustrates the connection portion at a connected state after the laminate electronic-module structure is heated. FIG. 13 is a perspective view of a spiral contactor.

A laminate electronic-module structure 80 shown in FIG. 8 is a laminate in which a plurality of electronic components are stacked. Examples of the electronic components include electronic modules 10 (individually indicated by reference numerals 10A, 10B, and 10C in FIG. 8) and bare chips 20 (individually indicated by reference numerals 20A, 20B, and 20C). The electronic modules 10 includes a packaged integrated circuit (IC) used as a CPU, microprocessor unit (MPU), memory (e.g., ROM and RAM) and image pickup element (e.g., CCD or complementary metal-oxide semiconductor (CMOS) image sensor). The electronic modules 10 and/or bare chips 20 are provided with a plurality of external contactors (electrodes) 18 arranged in, for example, a matrix at the bottom surface thereof.

First, a holding sheet 81 included in the laminate electronic-module structure is described below.

The electronic components described above are secured to a holding sheet 81 which is in the form of tape that linearly extends in one direction, as shown in FIG. 9. Hereinafter, the electronic modules 10A, 10B, 10C are mainly described as examples of the electronic components. The explanation thereof is applied to the bare chips 20.

The holding sheet 81 is a flexible sheet made of a material that has heat-resisting and insulating properties (e.g., polyimide). As shown in FIG. 9, the holding sheet 81 in the present embodiment includes first mounting portion 82A, second mounting portion 82B, third mounting portion 82C, first folding portion 82a disposed between the first mounting portion 82A and second mounting portion 82B, and second folding portion 82b disposed between second mounting portion 82B and third mounting portion 82C. In the laminate electronic-module structure 80 shown in FIG. 8, the first mounting portion 82A is at the lowest layer, the second mounting portion 82B is at the intermediate layer, and the third mounting portion 82C is at the highest layer.

As shown in FIGS. 10 to 12, the first mounting portion 82A to third mounting portion 82C are provided with a plurality of holes 83 which pass through the holding sheet 81 in the thickness direction thereof (Z direction).

The edges of the holes 83 are provided with flanged upper connection portions 84a and lower connection portions 84b on both front and back surfaces of the holding sheet 81. The upper connection portions 84a are conductively connected to the lower connection portions 84b with coupling portions 84c which are disposed therebetween on the inner walls of the holes 83. Each of the upper connection portions 84a, lower connection portions 84b, and coupling portions 84c is formed by copper plating, gold plating, or other means. Both front and back surfaces of the holding sheet 81 are provided with wiring patterns for interconnecting predetermined part of the upper connection portions 84a and those for interconnecting predetermined part of the lower connection portions 84b.

The lower connection portions 84b in the first mounting portion 82A at the lowest layer are provided with external contactors 85 for connecting to external electrodes. Examples of the external contactors 85 include spherical contactors (BGA), as shown by dotted lines, planer electrodes (LGA), cone-shaped contactors (CGA), and pin contactors (PGA), which are not shown.

The upper connection portions 84a are provided with elastic contacts functioning as connecting means. For example, the elastic contacts can be planer spiral contactors 40A, as shown in FIG. 13. In FIG. 9, the spiral contactors 40A are simply indicated by hatching lines.

For each of the spiral contactors 40A in the present embodiment, a base portion 41 is secured to the front surface of the upper connection portion 84a with an adhesive (not illustrated) disposed therebetween, a transformable portion 42 spirally extends from the base portion 41, and a leading end 43 of the transformable portion 42 extends toward the center of both the hole 83 and the coupling portion 84c. Therefore, the transformable portion 42 and leading end 43 are in a state in which both are elastically deformable from the upper surface to the lower surface in the hole 83 (in the Z2 direction).

The spiral contactor 40A at the front surface of the holding sheet 81 is conductively connected to the corresponding external contactor 85 at the back surface thereof via the upper connection portion 84a, coupling portions 84c, and lower connection portions 84b.

A securing device (positioning socket) 60 for temporarily attaching the electronic modules 10A, 10B, and 10C to the holding sheet 81 is described next.

Figure 14:
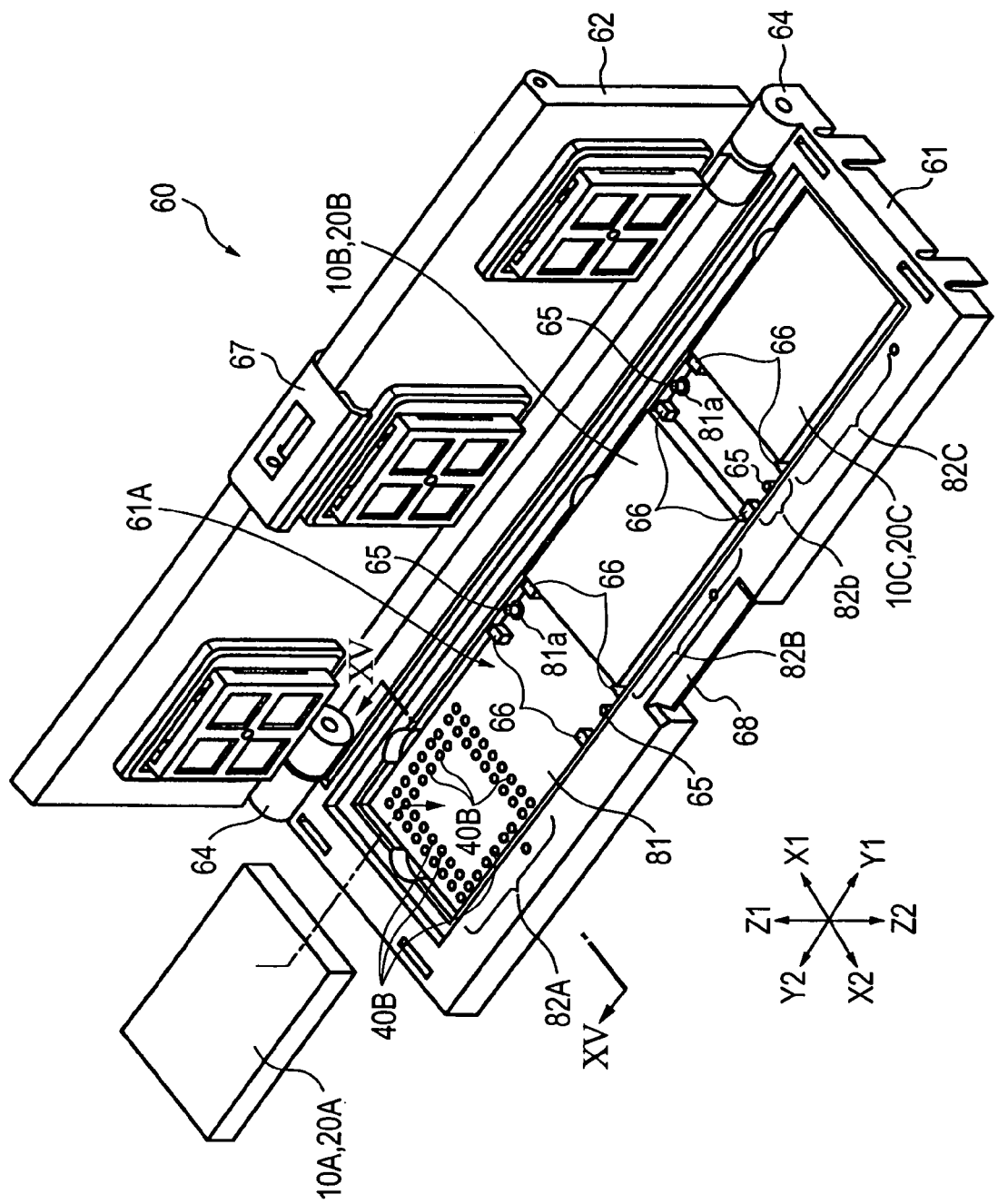
FIG. 14 is a perspective view of a securing device within which the electronic modules are temporarily attached to a holding sheet.
Figure 15:
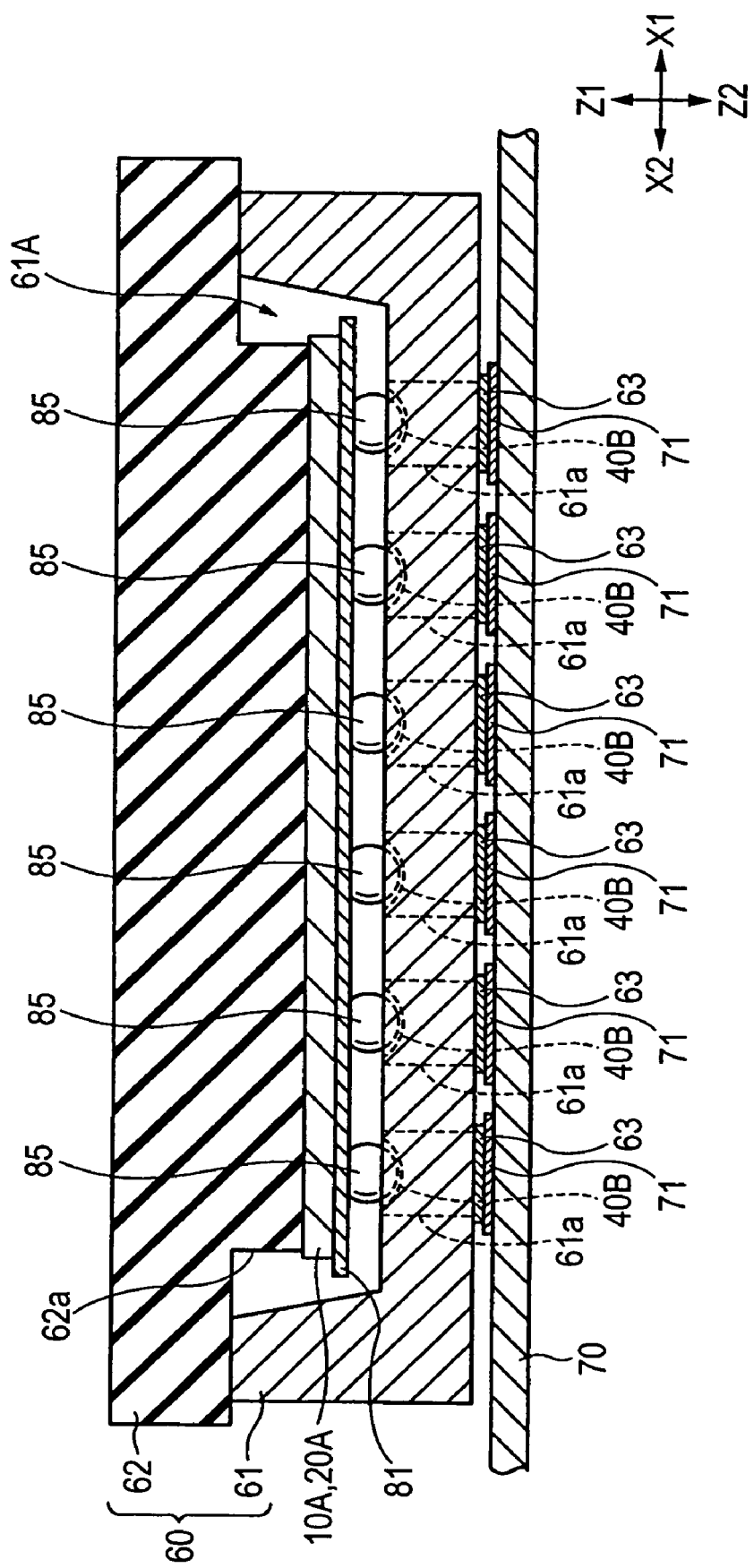
FIG. 15 is a sectional view taken along the line XV-XV in FIG. 14.

FIG. 14 is a perspective view of the securing device within which the electronic modules are temporarily attached to the holding sheet. FIG. 15 is a sectional view taken along the line XV-XV in FIG. 14. The securing device 60 is a jig used when a matching test between the electronic modules 10A, 10B, and 10C is performed and when the electronic modules 10A, 10B, and 10C are secured to the holding sheet 81.

As shown in FIG. 14, the securing device 60 includes a base 61, hinge 64, and lid 62 which is pivotally supported by the base 61 via the hinge 64. Each of the base 61 and the lid 62 is made of a resin that has both heat-resisting and insulating properties. At the central area of the base 61, a mounting portion 61A which is concave in the Z1 direction is disposed. The mounting portion 61A is formed such that the electronic modules 10A, 10B, and 10C can be mounted therein. The mounting portion 61A is provided with positioning pins 65 for positioning the holding sheet 81 and projections 66 for positioning the electronic modules 10A, 10B, and 10C. Fitting the positioning pins 65 into corresponding positioning holes 81a formed in the holding sheet 81 allow the holding sheet 81 to be positioned in the mounting portion 61A. The electronic modules 10A, 10B, and 10C can be positioned at individual predetermined places (corresponding to the mounting portions 82A, 82B, 82C, respectively) by being limited by means of the projections 66 in the opposite ends (in X1 and X2 direction).

As shown in FIG. 15, the mounting portion 61A is provided with a plurality of through holes 61a which have a predetermined diameter and pass through the base 61 from the front surface of the mounting portion 61A to the back surface of the base 61. The through holes 61a are arranged so as to correspond to the plurality of external contactors 85 disposed on a lower face (which is a face in the Z2 direction) of the first mounting portion 82A of the holding sheet 81. The through holes 61a include individual conducting portions formed by copper plating or gold plating at the inner wall thereof. The conducting portions are individually connected to a plurality of connection terminals 63 disposed on the bottom surface of the base 61.

The bottom surfaces of the second mounting portion 82B and third mounting portion 82C of the holding sheet 81 are not provided with the external contactors 85. Therefore, a front face section of the base 61 that faces the second mounting portion 82B and third mounting portion 82C has no through hole 61a.

On the upper portion of the through holes 61a (front surface of the mounting portion 61A), spiral contactors 40B functioning as elastic contacts are disposed so as to be opposed to the external contactors 85. Each of the spiral contactor 40B has the same structure as that of the spiral contactor 40A, which is shown in FIG. 13. Specifically, a base portion 41 is flush with a transformable portion 42 and a leading end 43 which inwardly extends in a spiral manner. Alternatively, the spiral contactor 40B may have a three-dimensional convex shape in which the transformable portion 42 rises gradually from the base portion 41 to the leading end 43 in the Z1 direction.

For the spiral contactor 40B, the transformable portion 42 is elastically deformable vertically (Z1 and Z2 directions). The spiral contactor 40B is elastically deformed away from the upper portion in the through hole 61a by being elastically pressed by the external contactor 85.

As shown in FIG. 6, under the base 61, a printed board 70 for testing which has a plurality of wiring patterns and other circuit components is disposed. The base 61 is secured on the printed board 70. The front surface of the printed board 70 is provided with opposing electrodes 71 which are opposed to the connection terminals 63 arranged on the bottom surface of the base 61. The opposing electrodes 71 are connected to a wiring pattern (not illustrated). As shown in FIG. 15, the connection terminals 63 at the base 61 are connected to the corresponding opposing electrodes 71 at the printed board 70 with conductive adhesives, soldering, or other means.

The lid 62 is provided with convex pressing portions 62a for pressing the electronic modules 10A, 10B, and 10C downwardly at the central portion of the inner face of the lid 62. The pressing portions 62a are opposed to the mounting portion 61A.

Between the inner face of the lid 62 and the pressing portions 62a, urging members for urging the corresponding pressing portions 62a in a direction that is remote from the inner face of the lid 62 is disposed (not illustrated). The urging members are typically coil springs. Therefore, closing the lid 62 after the electronic modules 10A, 10B, and 10C are mounted at predetermined positions in the mounting portion 61A allows the electronic modules 10A, 10B, and 10C to be elastically urged in the Z2 direction, i.e., against the holding sheet 81.

The lid 62 and the base 61 is provided with a set of locking mechanism consisting a locking member 67 and a supporting member 68. Engaging the locking member 67 with the supporting member 68 allows a pressed state, in which the electronic modules 10A, 10B, and 10C are pressed against the holding sheet 81, to be performed continuously. When the pressed stated is set, the holding sheet 81 and the electronic modules 10A, 10B, and 10C are at the temporarily attached state described above.

At this time, the external contactors 85 at the lower surface of the holding sheet 81 also press the spiral contactors 40B in the mounting portion 61A. This sets a state in which the external contactors 18 at the electronic modules 10A, 10B, and 10C are electrically connected to the wiring patterns at the printed board 70 via the upper connection portions 84a, coupling portions 84c, lower connection portions 84b, external contactors 85, spiral contactors 40B, conducting portions, connection terminals 63, and opposing electrodes 71.

As a result, a matching test for the laminate electronic-module structure, i.e., the electronic modules 10A, 10B, and 10C attached to the holding sheet 81 can be performed by receiving an externally input signal from the wiring patterns formed on the printed board 70.

Figure 16:
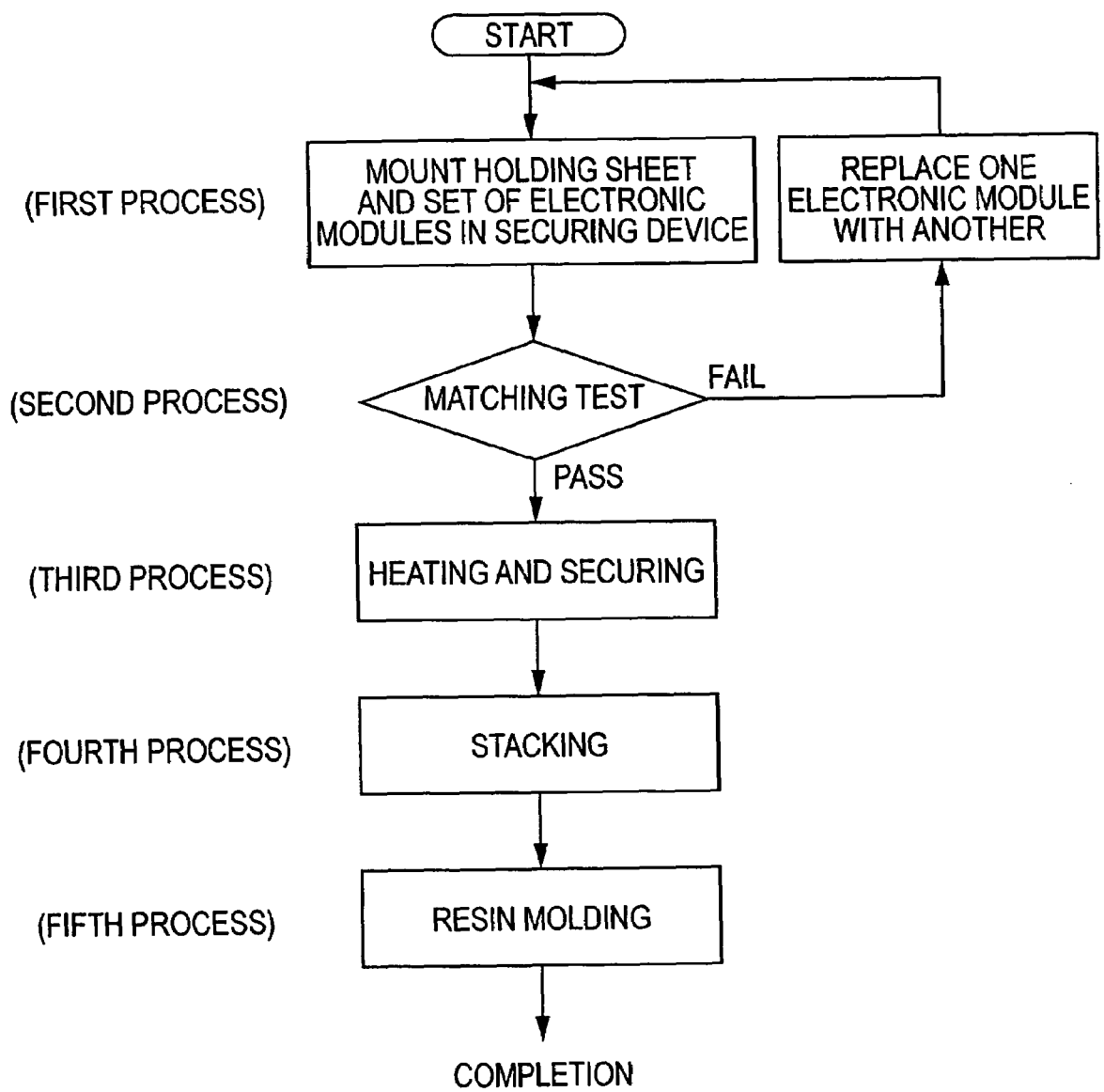
FIG. 16 is a flowchart of a process of manufacturing the laminate electronic-module structure as a manufacturing method according to the present invention.

A method for manufacturing the laminate electronic-module structure is described below with reference to FIG. 16. FIG. 16 is a flowchart of a process of manufacturing the laminate electronic-module structure as a manufacturing method according to the present invention.

In the first manufacturing process, as shown in FIG. 14, the holding sheet 81 and a set of the electronic modules 10A, 10B, and 10C at an opened state are positioned in place and are mounted in the mounting portion 61A in the securing device 60. The electronic modules 10A, 10B, and 10C are placed on the first mounting portion 82A, second mounting portion 82B, third mounting portion 82C in the holding sheet 81, respectively.

At this time, as shown in FIG. 10, between the upper surface of the holding sheet 81 and the lower surface of the electronic module 10A, an adhesive member 89 are provided. Examples of the adhesive member 89 include a nonconductive paste (NCP) and a nonconductive film (NCF) that have thermosetting or thermoplastic properties.

Securing using the adhesive member described above is apt to be a semipermanent connection because a surface metal connection between a metal pad on the device and the surface of an elastic contact is prone to be produced. As a result, a mechanically and electrically stable connection can be realized easily.

The adhesive member 89 is provided with a plurality of holes 89a which have an inside diameter that is slightly larger that the diameter of each of the spherical external contactors (spherical contactors) 18 disposed on the electronic module 10A. The adhesive member 89 is disposed such that the holes 89a are opposed to the corresponding spiral contactors 40A disposed on the first mounting portion 82A, second mounting portion 82B, and third mounting portion 82C.

Subsequently, the lid 62 is closed, and a locked state in which the locking member 67 of the lid 62 is engaged with and supporting member 68 of the base 61 is set. At this time, as shown in FIG. 11, the external contactors 18 of the electronic module 10A are inserted into the corresponding holes 89a in the adhesive member 89. Then, the electronic module 10A and holding sheet 81 is set at the temporarily attached state, in which the external contactors 18 are in contact with the corresponding spiral contactors 40A. The same applies to the electronic modules 10B and 10C.

In the second manufacturing process, a matching test between a set of the electronic modules 10A, 10B, and 10C is performed by externally inputting an electrical signal to the external contactors 18 on the electronic modules 10A, 10B, and 10C. The matching test includes various tests. Examples of the matching test include a test for continuity, a test for impedance matching, a test for on-resistance measurement between terminals, a leakage current test, and a combination thereof.

In the third manufacturing process, an electronic module 10A that has passed testing is sent to a heating process. Specifically, the securing device 60 in which the electronic modules 10A, 10B, and 10C is temporarily attached to the adhesive member 89 is placed in a furnace and is heated for a predetermined period of time at a predetermined temperature. In this process, the application of pressure may be used, if necessary.

In the third manufacturing process (heating process), the adhesive member 89 disposed between the lower surface of the electronic modules 10A, 10B, and 10C and the front surface of the holding sheet 81 becomes hard and rigid by being heated, thus securing the electronic modules 10A, 10B, and 10C on the first mounting portion 82A, second mounting portion 82B, and third mounting portion 82C on the holding sheet 81.

In the course of cooling, the adhesive member 89 is heat shrunk. Therefore, the distance from the electronic modules 10A, 10B, and 10C to the holding sheet 81 can be reduced. When the electronic modules 10A, 10B, and 10C approach the holding sheet 81, as shown in FIG. 12, the external contactors 18 press the front surface of the spiral contactors 40A in Z2 direction. As a result, after they are secured, a good connection can be set in which the external contactors 18 are continuously in contact with the spiral contactors 40A.

In the fourth manufacturing process, the holding sheet 81 to which the electronic modules 10A, 10B, and 10C are adhesively attached is removed from the securing device 60, and the removed holding sheet 81 with the electronic modules 10A, 10B, and 10C is molded into the laminate electronic-module structure 80, as shown in FIG. 8.

More specifically, as shown in FIG. 8, the holding sheet 81 is folded at the first folding portion 82a in the a direction so as to have a U-shaped form, so that the second electronic module 10B is stacked on the top of the electronic module 10A. Subsequently, the holding sheet 81 is folded at the second folding portion 82b in the β direction, which is opposite to the a direction, so as to have a U-shaped form, so that the third electronic module 10C is stacked on the top of the second electronic module 10B. In this way, the laminate electronic-module structure 80 shown in FIG. 8 is formed.

Between the back surfaces of the holding sheet 81, which are opposite surfaces of the second folding portion 82b (between the back surface of the second mounting portion 82B and the back surface of the third mounting portion 82C), an insulating film sheet for preventing shorts is disposed (not illustrated).

In the last fifth manufacturing process, the three-layer laminate electronic-module structure 80 is resin-molded, thus completing the manufacture of a single MCM.

The laminate electronic-module structure 80 as so formed is shipped as a known good die (KGD).

In the second manufacturing process (matching test process), if the result of the test is fail, processing goes back to the first manufacturing process. From the set of the electronic modules 10A, 10B, and 10C, the electronic module 10A is removed, for example, and replaced with a new electronic module 10A. Then, in the second manufacturing process, the matching test is carried out again.

If a new set of the electronic modules 10A, 10B, and 10C passes the retest, the set proceeds to the third process and the subsequent processes. The removed electronic module 10A is discarded because the probability is high that it has been a defective. Alternatively, the removed bare chip 20A may be sent to a through inspection process.

If the result of the retest is fail, the probability is high that another electronic module has been a defective. Therefore, the second electronic module 10B is removed, for example, a new second electronic module 10B is mounted, and then, a test that is similar to the foregoing is performed. If a new set of the electronic modules 10A, 10B, and 10C, which includes a newly replaced second electronic module 10B, passes the retest, the new set proceeds to the third manufacturing process and the subsequent manufacturing processes, as previously described.

Therefore, according to the present invention, the use of the securing device 60 enables the electronic modules 10A, 10B, and 10C to be freely removable from the holding sheet 81 individually. As a result, unlike the known art, a matching test can be performed in a temporarily attached state before the electronic modules are secured to the holding sheet 81.

Therefore, only a combination of electronic modules that have passed testing can be manufactured as the laminate electronic-module structure 80. As a result, the yield (the ratio of the number of products other than defectives to the total number of products manufactured in a manufacturing line) of the laminate electronic-module structure 80 can be improved.

Additionally, an electronic module that has been determined to be defective when used in a combination but is a good module when used in another combination is not discarded. As a result, only an electronic module that has been finally determined to be defective can be discarded, so that the number of discarded electronic modules can be reduced. Therefore, the yield of electronic modules can be improved.

In the above embodiments, an electronic module (e.g., a CPU and memory) and a semiconductor bare chip are described as examples of an element mounted on the holding sheet. However, the present invention is not limited to this. For example, a thermal head, small microphone, speaker, display, substrate, camera module (e.g., a CCD and CMOS image sensor), and fingerprint sensor may be mounted.

The holding sheet 81 is not limited to tape that linearly extends in one direction, as described above. The holding sheet 81 may have any shape as long as an electronic module can be stacked three-dimensionally. For example, the holding sheet 81 may have a cross arrangement in one plane.

What is claimed is:

1. A method for manufacturing an electronic module, the method comprising:
    a first step of mounting a set of electronic components having electrodes and one of thermosetting adhesive members and thermoplastic adhesive members in cavities of a holder for an electronic component, the holder comprising the cavities for mounting the set of electronic components therein, connecting means disposed on a first surface of the holder within each of the cavities so as to be opposed to the electrodes and provided with elastic contacts that allow the connecting means to be connected to and disconnected from the electrodes freely, and external contactors conductively connected to the connecting means and disposed on a second surface of the holder, the second surface being opposite each of the cavities;
    a second step of attaching the holder to a securing member and setting electrical continuity between the electrodes of the set of electronic components and the connecting means of the holder;
    a third step of receiving an externally input electrical signal and performing a matching test between the set of electronic components in the holder;
    a fourth step of adhesively securing the set of electronic components to the cavities using the adhesive members by heating the holder; and
    wherein, when the result of the matching test in the third step is fail, the first step to the third step are performed again from the first step after one electronic component of the set of electronic components is replaced with another new electronic component.

2. A method for manufacturing an electronic module, the method comprising:
    a first step of mounting a holding sheet, a plurality of electronic components, and one of a thermosetting adhesive member and a thermoplastic adhesive member in a securing device, the holding sheet comprising a sheet having a plurality of mounting portions at a first side of the sheet, each mounting portion being used for mounting an electronic component having an electrode thereon and provided with connecting means for connecting to the electrode, the connecting means being provided with elastic contacts that allow the connecting means to be connected to and disconnected from the electrode freely, and external contactors conductively connected to the connecting means in a continuous manner and disposed on a second side of the sheet, the second side being opposite each of the mounting portions;
    a second step of receiving an externally input electrical signal and performing a matching test between the plurality of electronic components;
    a third step of adhesively securing the plurality of electronic components to the holding sheet by heating the securing device in which the plurality of electronic components are mounted; and
    a fourth step of stacking a first electronic component above a second electronic component by folding the holding sheet after the third step is performed.

3. The method according to claim 2, wherein, when the result of the matching test in the second step is fail, the first and second steps are performed again from the first step after one electronic component of the plurality of electronic components is replaced with another new electronic component.

* * * * *